(12) United States Patent
Kintali et al.

(10) Patent No.: US 10,936,769 B2
(45) Date of Patent: Mar. 2, 2021

(54) SYSTEMS AND METHODS FOR MEASURING ERROR IN TERMS OF UNIT IN LAST PLACE

(71) Applicant: The MathWorks, Inc., Natick, MA (US)

(72) Inventors: Kiran K. Kintali, Needham, MA (US); Shomit Dutta, Ashland, MA (US); E. Mehran Mestchian, Newton, MA (US); Pieter J. Mosterman, Waltham, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 16/409,165

(22) Filed: May 10, 2019

(65) Prior Publication Data

US 2019/0332732 A1 Oct. 31, 2019

Related U.S. Application Data

(63) Continuation-in-part of application No. 16/198,299, filed on Nov. 21, 2018, which is a
(Continued)

(51) Int. Cl.
*G06F 9/44* (2018.01)
*G06F 30/20* (2020.01)
(Continued)

(52) U.S. Cl.
CPC .......... *G06F 30/20* (2020.01); *G06F 7/49915* (2013.01); *G06F 8/35* (2013.01); *H03M 7/24* (2013.01); *H03M 7/28* (2013.01)

(58) Field of Classification Search
CPC .................................................. G06F 11/261
(Continued)

(56) References Cited

U.S. PATENT DOCUMENTS 5,561,615 A 10/1996 Kuo et al.
5,764,555 A * 6/1998 McPherson ............. G06F 7/535
708/497
(Continued)

FOREIGN PATENT DOCUMENTS

WO WO-2007/035702 A2 3/2007
WO WO-2008/027590 A2 3/2008

OTHER PUBLICATIONS

Anjanasasidharan, Ms., et al. "Vhdl Implementation of IEEE 754 Floating Point Unit," IEEE, International Conference on Information Communication and Embedded Systems (ICICES2014), Feb. 1, 2014, pp. 1-5.
(Continued)

*Primary Examiner* — Evral E Bodden
(74) *Attorney, Agent, or Firm* — Cesari and McKenna, LLP; Michael R. Reinemann

(57) ABSTRACT

Systems and methods evaluate simulation models and measure floating point arithmetic errors in terms of Unit in Last Place (ULP). The simulation model may include model elements that perform numerical computations using Native Floating Point (NFP) arithmetic. The model elements may be arranged to implement a procedure. A data store may include local ULP errors predetermined for the model elements. The systems and methods may retrieve the local ULP errors for the model elements included in the model, and may apply a rules-based analysis to compute an overall ULP error of the simulation model. The systems and methods may present the overall ULP computed for the model. The systems and methods may also present intermediate ULP errors determined for portions of the simulation model. Changes may be made to the model to reduce the overall ULP error.

51 Claims, 22 Drawing Sheets

Related U.S. Application Data continuation-in-part of application No. 15/398,176, filed on Jan. 4, 2017, now Pat. No. 10,140,099.

(60) Provisional application No. 62/344,310, filed on Jun. 1, 2016, provisional application No. 62/729,504, filed on Sep. 11, 2018.

(51) Int. Cl.
| | |
|---|---|
| *H03M 7/28* | (2006.01) |
| *G06F 8/35* | (2018.01) |
| *H03M 7/24* | (2006.01) |
| *G06F 7/499* | (2006.01) |

(58) Field of Classification Search
USPC .......................................................... 717/104
See application file for complete search history.

(56) References Cited

U.S. PATENT DOCUMENTS

| | | | |
|---|---|---|---|
| 7,085,702 | B1 | 8/2006 | Hwang et al. |
| 7,110,935 | B1 | 9/2006 | Hwang et al. |
| 7,318,014 | B1 | 1/2008 | Molson et al. |
| 7,969,452 | B2 | 6/2011 | Clark et al. |
| 8,135,570 | B2 | 3/2012 | Linebarger et al. |
| 8,407,271 | B2 | 3/2013 | Hurd et al. |
| 8,484,262 | B1 | 7/2013 | Bryan |
| 8,984,496 | B2 | 3/2015 | Devane et al. |
| 9,075,630 | B1 | 7/2015 | Smith et al. |
| 9,436,442 | B1 | 9/2016 | Kintali et al. |
| 9,454,627 | B1 | 9/2016 | Venkataramani et al. |
| 10,140,099 | B2 | 11/2018 | Kintali et al. |
| 2005/0039107 | A1 | 2/2005 | Hander et al. |
| 2008/0040409 | A1 | 2/2008 | Matsuzaki |
| 2008/0109100 | A1 | 5/2008 | Macharia et al. |
| 2009/0094307 | A1* | 4/2009 | Ault ..................... G06F 7/5446 708/441 |
| 2012/0173465 | A1 | 7/2012 | Hore et al. |
| 2012/0259904 | A1 | 10/2012 | Bishop |
| 2013/0007085 | A1* | 1/2013 | Drane ..................... G06F 30/30 708/551 |
| 2014/0279815 | A1 | 9/2014 | Wang et al. |
| 2016/0357534 | A1 | 12/2016 | Krishnamoorthi et al. |
| 2017/0316116 | A1* | 11/2017 | Elliott ..................... G06F 7/552 |
| 2019/0095303 | A1 | 3/2019 | Kintali et al. |

OTHER PUBLICATIONS

Banerjee, P., "An Overview of a Compiler for Mapping MATLAB Programs onto FPGAs", Department of Electrical and Computer Engineering, Northwestern University, IEEE, Proceedings of the ASP-DAC Asia and South Pacific Design Automation Conference, Kitakyushu, Japan, Japan, Jan. 24, 2003, 6 pages.

Belanovíc, Pavle, et al., "Automated Floating-point to Fixed-point Conversion with the fixify Environment," CD Laboratory for Design Methodology of Signal Processing Algorithms Vienna University of Technology, Austria, IEEE, IEEE Computer Society, Proceedings of the 16th International Workshop on Rapid System Prototyping 2005, (RSP'05), Montreal, Quebec, Canada, Jun. 8-10, 2005, pp. 1-7.

Bryant, Randal E., et al., "Deciding Bit-Vector Arithmetic with Abstraction," O. Grumberg and M. Huth (eds.), TACAS 2007, LNCS 4424, Springer-Verlag Berlin Heidelberg, Mar. 2007, pp. 358-372.

Chou, Bill, et al., "Converting Models from Floating Point to Fixed Point for Production Code Generation," The MathWorks, Inc., MATLAB Digest, Nov. 2008, pp. 1-6.

"CORE Generator Guide," XILINX, Xilinix, Inc., 2003, pp. 1-146.

"European Search Report," European Application No. 17173986, dated Oct. 2, 2017, pp. 1-5.

"Fixed-Point Designer™: User's Guide," R2016a, The Math Works, Inc., Mar. 2016 pp. 1-2124.

"Floating-point Arithmetic," Wikipedia, May 26, 2016, Retrieved from the Internet: <https://en.wikipedia.org/w/index.php?title=Floating-point_arithmetic&oldid=722188619#Addition_and_subtraction>, Retrieved on Jul. 12, 2017, pp. 1-27.

Harries, Ian, "Floating Point Numbers," retrieved from <https://www.doc.ic.ac.uk/~eedwards/compsys/float/>, Dec. 2, 2004, pp. 1-5.

"HDL Coder™: User's Guide," R2016a, The Math Works, Inc., Mar. 2016, pp. 1-1264.

"HDL Coder™: User's Guide," R2018a, The Math Works, Inc., Mar. 2018, pp. 1-1516.

Marcus, Guillermo, et al. "A Fully Synthesizable Single-Precision, Floating-Point Adder/Substractor and Multiplier in VHDL for General and Educational Use," IEEE, Proceedings of the Fifth IEEE International Caracas Conference on Devices, Circuits and Systems, Dominican Republic, vol. 1, Nov. 3-5, 2004, pp. 319-323.

Marcus, Guillermo, "VHDL Entity work.FPadd.symbol: VHDL Entity work.FPadd.single_sycle," Jan. 1, 2004, Retrieved from the Internet: <https://opencores.org/download,fpuvhd1>, Retrieved on Jul. 13, 2017pp. 1-10.

"MATLAB to FPGA Using HDL Coder(TM)," Loren on the Art of MATLAB, Published with MATLAB R2013a, retrieved from <http://blogs.mathworks.com/loren/2013/04/11/matlab-to-fpga-using-hdl-codertm/>, Apr. 11, 2013, pp. 1-12.

Roy, Sanghamitra, et al., "An Algorithm for Converting Floating-Point Computations to Fixed-Point in MATLAB based FPGA design," ACM, DAC'04, San Diego, California, USA, Jun. 7-11, 2004, pp. 484-487.

Roy, Sanghamitra , et al., "An Algorithm for Converting Floating-Point Computations to Fixed-Point in MATLAB based FPGA design," Northwestern University-DAC'04, ACM, Proceedings of the 41st Design Automation Conference, 2004, San Diego, California, USA, Jun. 7-11, 2004, pp. 484-487.

Shi, Changchun, et al., "An Automated Floating-Point to Fixed-Point Conversion Methodology," Berkeley Wireless Research Center, Department of EECS, University of California, Berkeley, USA, IEEE, 2003 IEEE International Conference on Acoustics, Speech, and Signal Processing, 2003, Proceedings, (ICASSP '03), Hong Kong, China, Apr. 6-10, 2003, pp. 1-4.

Wang, Cheng, et al., "An Automated Fixed-Point Optimization Tool in MATLAB XSG/SynDSP Environment," Review Article, International Scholarly Research Network, ISRN Signal Processing, vol. 2011, Article ID 414293, Jan. 20, 2011, pp. 1-17.

Zhang, Linsheng, et al., "Floating-point to Fixed-point Transformation using Extreme Value Theory," Department of Electronic and Information Engineering Harbin Institute of Technology Shenzhen Graduate School Shenzhen 518055, China, IEEE Computer Society, 2009 Eight IEEE/ACIS International Conference on Computer and Information Science, Shanghai, China, Jun. 1-3, 2009, pp. 271-276.

Zhao, Jisheng, et al., "Intermediate Language Extensions for Parallelism," ACM, SPLASH'11 Workshops, Portland, Oregon, USA, Oct. 23-24, 2011, pp. 1-12.

\* cited by examiner

```
1   function err = ulpErrorCompute(result, expResult)
2        resultInt = typecast(result, 'int64');
3        expResultInt = typecast(expResult, 'int64');
4        same_sign = (sign(result) == sign(expResult));
5        if (same_sign) % same sign
6             err = abs(resultInt - expResultInt);
7        else % different sign
8             err = (abs(resultInt) + abs(expResultInt));
9        end
10  end
```

*FIG. 3*

```
1   function err = ulpErrorCheck(P, R, tolerance)
2       P_fpt = fi(typecast(P, 'int64'), 1,64,0);
3       R_fpt = fi(typecast(R, 'int64'), 1,64,0);
4       same_sign = (sign(P) == sign(R));
5       if (same_sign) % same sign
6           err = (abs(P_fpt - R_fpt) <= tolerance);
7       else % different sign
8           err = ((abs(P_fpt) + abs(R_fpt) <= tolerance);
9       end
10  end
```

SYSTEMS AND METHODS FOR MEASURING ERROR IN TERMS OF UNIT IN LAST PLACE

CROSS-REFERENCE TO RELATED APPLICATIONS

The present application is a continuation-in-part of application Ser. No. 16/198,299 filed Nov. 21, 2018 by Kiran K. Kintali et al. for Systems and Methods for Generating Code from Executable Models with Floating Point Data, which is a continuation-in-part of application Ser. No. 15/398,176 filed Jan. 4, 2017 by Kiran K. Kintali et al. for Systems and Methods for Generating Code from Executable Models with Floating Point Data, now U.S. Pat. No. 10,140,099, which claims the benefit of Provisional Application Ser. No. 62/344,310 filed Jun. 1, 2016 by Kiran K. Kintali et al. for Systems and Methods for Generating Code from Executable Models with Floating Point Data.

The present application also claims the benefit of Provisional Application Ser. No. 62/729,504 filed Sep. 11, 2018 by Kiran K. Kintali et al. for Systems and Methods for Measuring Error in Terms of Unit in Last Place.

The above-identified applications are hereby incorporated by reference in their entireties.

COMPUTER PROGRAM LISTING

A portion of the disclosure of this patent document contains material that is subject to copyright protection. The copyright owner has no objection to facsimile reproduction by anyone of the patent document for the patent disclosure, as it appears in the United States Patent and Trademark Office patent file or records, but otherwise reserves all copyright rights whatsoever. Copyright © 2018 The MathWorks, Inc.

BRIEF DESCRIPTION OF THE DRAWINGS

The description below refers to the accompanying drawings, of which:

FIG. 3 is an example code listing of a function for computing ULP accuracy of model elements in accordance with one or more embodiments;

FIG. 16 is an example code listing of a function for checking ULP accuracy during verification in accordance with one or more embodiments;

DETAILED DESCRIPTION OF ILLUSTRATIVE EMBODIMENTS

Figure 1:
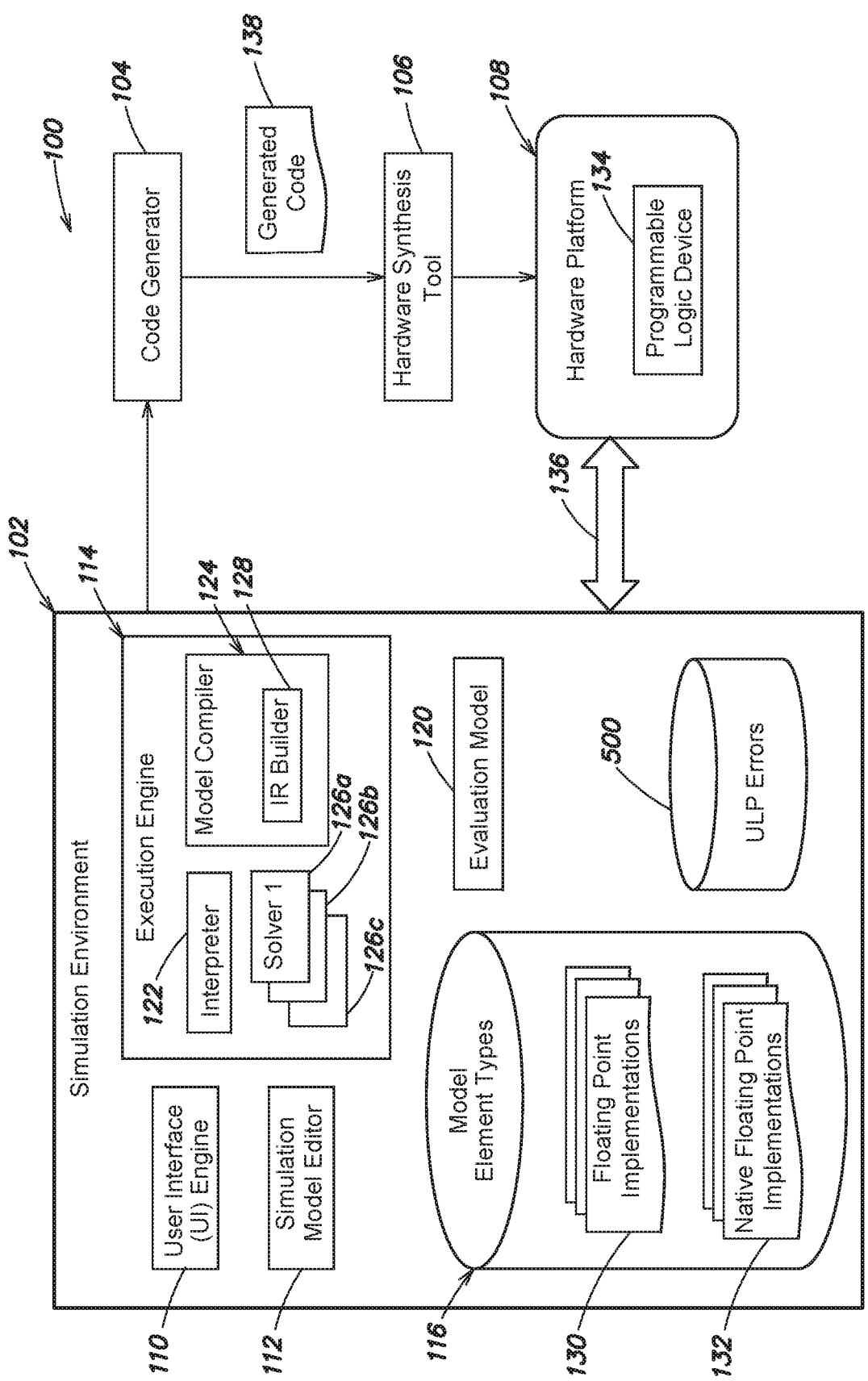
FIG. 1 is a schematic illustration of an example test environment for determining the Unit in Last Place (ULP) accuracy of model elements in accordance with one or more embodiments.

Electronic devices, such as consumer electronics, appliances, and controllers used in factories, automobiles, and aircraft often include programmable logic devices, such as Application Specific Integrated Circuits (ASICs), Field Programmable Gate Arrays (FPGAs), or Complex Programmable Logic Devices (CPLDs), configured to perform various operations. Electronic devices may alternatively or additionally include microcontrollers, such as Digital Signal Processors (DSPs). The programmable logic devices and microcontrollers may be configured with program code. The configuration of such devices may start with a modeling phase. For example, a simulation model may be created to model the operation of the electronic device. The model may include model elements that perform numerical computations, and the model elements may be arranged to perform an algorithm or procedure. The simulation model may be refined until its behavior matches the desired operation of the electronic device, for example as set forth in a functional specification for the device. The simulation model may be translated into program code, and the generated program code may be used to configure the electronic device, deploying the algorithm or procedure.

Variables, such as signals, parameters, states, or other numeric data processed by or included in a simulation model, such as a Simulink model, or in a program, such as a MATLAB program, may have a data type. Data type refers to the way in which numbers are represented in computer memory. A data type may determine the amount of storage allocated to a number, the method used to encode the number's value as a pattern of binary digits, and the operations available for manipulating the data type. Different data types may have different precision, dynamic range, performance, and memory usage. A modeling environment may support multiple different data types. An exemplary, non-inclusive list of numeric data types includes: integers, floating point, fixed point, and Boolean.

Floating point data types may contain fractional values. An exemplary, non-inclusive list of floating point data types includes: quadruple precision floating point (quad), double-precision floating point (double), single-precision floating point (single), and half-precision floating point (half). A floating point data type represents numeric values in scientific notation. The Institute of Electrical and Electronics Engineers (IEEE) Standard for Floating Point Arithmetic 754 (IEEE 754) specifies standards for floating point computations, and defines several floating point formats commonly used in computing. These floating point formats include 64-bit double-precision binary floating point (double), 32-bit single-precision binary floating point (single), and 16-bit half-precision binary floating point (half), among others. A floating point format may have a word length, and may include a 1-bit sign (S) value, a multi-bit exponent (E) value, and a multi-bit mantissa (M) or fractional value. For a single floating point format, the word length is 32-bits, the sign bit is at bit position 31, the exponent is 8-bits and is located at bit positions 23-30, and the mantissa is 23-bits and is located at bit positions 0-22. For performance reasons, such as area consumption on hardware, custom floating point formats may be utilized having exponent and mantissa lengths different from those used in double, single, and half floating point formats. For example, floating point formats having 24-32 bit word lengths may be used. A normalized number always has a mantissa or fractional value (also referred to as a significand) with a leading 1, which is not stored in floating point formats. Floating point data types are unable to represent all real numbers because the number of bits used is fixed.

The number of bits allocated to the exponent of a floating point format set the upper and lower limits on the range, e.g., the magnitude, of the numbers that can be represented with that floating point format. For the single precision floating point data type, the largest number that can be represented is $3.403 \times 10^{38}$, and the smallest positive normal number that can be represented is $1.175 \times 10^{-38}$. Attempting to create a number that is too large, e.g., a number that exceeds the upper limit, is called an overflow error. Options include setting the result to positive or minus infinity or Not a Number (NaN) depending on the context. Attempting to create a number that is too small, e.g., a number that is less than the lower limit, is called an underflow error. These values are referred to as denormals, since they do not have a leading 1. The IEEE 754 standard provides support for denormals also referred to as subnormals by using a biased exponent of 0. For architectures that do not support denormals/subnormals, the result is set to zero.

A modeling environment may assign default data types to variables or other data, for example based on the model elements included in a model. In addition, variables or model elements may inherit data types from other variables or model elements. A default data type may be overridden, for example by a user choosing a particular data type for one or more variables or other data of a model. In some situations, it may be desirable to use floating point numeric data types in a model, such as double or single precision floating point data types, as default data types, because those data types provide a wide dynamic range, for example as compared to fixed point, and may be useful when the range of variable values computed by a model is unknown. Floating-point data types may also be more suitable with non-linear operations and with reciprocal operations (in which small inputs may create large outputs, and large inputs may create small outputs, etc.)

The ability to specify the data types of variables or data in a model such as a model's signals and block parameters is particularly useful when modeling real-time control applications. For example, the data types specified for a simulation model may also be used in code generated from the model by a code generation tool, and the generated code may be deployed on a physical system operating in real-time. Optimizing the data types specified in the simulation model can dramatically increase the performance and decrease the size of the code generated from the model. For example, going from any of double precision to single precision to fixed point to integer data types can reduce the memory requirements to execute the generate code, such as reducing the hardware area requirements when deploying the generated code on an FPGA or ASIC.

The use of floating point data types to perform numerical computations can introduce errors into a computer program, such as rounding errors, cancellation errors, and truncation (or mathematical approximation) errors. Rounding errors, which can be produced in any operation, occur when there is no floating-point representation for the exact result of an operation (or for an input or constant value being converted to floating-point format). For example, values such as 0.1, ⅓, π (pi), etc., cannot be represented exactly in floating-point format.

Several rounding modes exist including round to nearest with ties to even, round toward zero (round inward), round toward positive infinity (round upward), and round toward negative infinity (round downward). The IEEE 754 standard uses the round to nearest with ties to even rounding mode. With this method, the ideal (infinitely precise) result of an arithmetic operation is rounded to the nearest representable value in floating-point format, and gives that representation as the result of the arithmetic operation. In the case of a tie, the value that would make the significand end in an even digit is chosen.

The term Unit in Last Place (ULP) refers to the gap between two numbers represented in floating point format that are nearest some given value, x, even if one of the floating point numbers is x. The gap varies with the magnitude of x. The term Unit in Last Place (ULP) for a number x refers to the distance between the two closest straddling floating-point numbers a and b (i.e., those with a≤x≤b and a≠b). The IEEE 754 specification requires that the result computed by elementary arithmetic operations be correctly rounded, which implies that in rounding to nearest, the rounded result is within 0.5 ULP of the mathematically exact result.

Cancellation errors occur when subtracting two numbers that are almost equal. In such cases, the most significant digits in the operands match and may cancel each other, leaving behind digits affected by rounding error. Local truncation (mathematical approximation) errors refer to the errors that arise when an approximation is used to perform some operation, such as a transcendental operation, e.g., trigonometric functions, logarithmic functions, and exponential functions, that typically cannot be directly calculated.

Rounding and cancellation errors may be propagated through a computer program, and may accumulate within the program. As a result, users, e.g., computer programmers, may wish to understand how accurate a computation is, and to determine a bound on the errors that may occur in a computer program. Two existing measures of the error in a computed quantity are absolute error and relative error. Absolute error is defined as:

Absolute Error=True Value−Computed Value where True Value refers to the mathematically exact result, and Computed Value refers to the value generated by the computer. Relative error is a measure of the error related to the size of the true value, and is defined as:

$$\text{Relative Error} = \frac{\text{Absolute Error}}{\text{True value}}$$

Rounding, cancellation, and mathematical approximation errors change the true value of an operation to a value that can be represented in a floating point format. The approximation errors can be considered to add noise to numerical computations. Failing to understand the scope of the errors, e.g., the noise, introduced when using floating-point data types in the design and evaluation of a computer program can lead to major or even catastrophic consequences. In a well-publicized example, a Patriot missile battery failed to intercept an incoming missile, because of accumulated rounding errors that occurred over time in the control program that represented the time generated by an internal clock (in tenths of a second) in floating-point data type given that $\frac{1}{10}$ cannot be represented exactly in floating-point format. Thus, errors from rounding, cancellation, and mathematical approximations resulting from the use of floating-point data types in numerical computations manifest as real and measurable errors in physical systems that rely on results of such numerical computations. For example, while a theoretical mathematical calculation may yield an exact result, a corresponding real-world computation with inexact representations of real numbers, may yields results skewed because of rounding, cancellation, and mathematical approximation errors. As a result, anomalous or hazardous system behavior may occur for deployed systems, such as an embedded controller or other physical system, that depend on mathematical calculations. Thus, a need exits to fully understand the scope of errors in computer programs that represent numbers in floating-point formats.

Briefly, the present disclosure relates to systems and methods for evaluating simulation models that use a floating point data type, and measuring the scope of error of the model in terms of Unit in Last Place (ULP). The systems and methods include an engine configured to conduct error analysis on a simulation model. The simulation model may be created in a simulation environment, and may include a plurality of model elements that perform numerical computations using Native Floating Point (NFP) arithmetic. The model elements may be arranged to implement a procedure, for example the procedure may model the operation of a controller. The error analysis engine may generate or access an in-memory intermediate representation (IR) of the simulation model, for example as part of compiling the model. The IR may be in the form of a graph having nodes associated with the model's model elements and edges associated with relationships defined among the model elements.

The error analysis engine may have access to one or more data storage structures, such as a library, a table, or other data store that includes local ULP errors previously determined for NFP implementations of model elements supported by the simulation environment. The error analysis engine may retrieve the local ULP errors determined for the model elements included in the model being analyzed from the data stored in a data storage structure otherwise referred to as a data store. The error analysis engine may apply a rules-based analysis to compute an overall ULP error of the simulation model based on the local ULP errors of the model elements included in the model. For example, the error analysis engine may examine the IR, and apply one or more rules to compute a total ULP error for the simulation model. Computing the total ULP error may involve determining how local ULP errors are propagated and accumulated through the model or through one or more parts of the model. A total ULP error may be determined for any combination of model elements/blocks/operations of a model. In some embodiments the model elements/blocks/operations may be arranged on a path of the model or may have another relationship with each other. The error analysis engine may present the total ULP error determined for the model, for example for evaluation by a user. In addition, the error analysis engine may annotate a visual presentation of the simulation model with graphical affordances that indicate intermediate ULP errors computed for one or more points in the simulation model. The graphical affordances may pinpoint locations within the model at which large and/or unexpected ULP errors occur, and may identify or assist in identifying the sources causing or contributing to such ULP errors. The error analysis engine may determine one or more changes that can be made to the model to reduce the total ULP error. The error analysis engine may generate and present one or more reports that include the one or more changes, e.g., as recommendations. For example, to reduce the total ULP error, the error analysis engine may determine that one or more model elements having local ULP errors may be replaced with model elements that have lower local ULP errors or with model elements having zero ULP errors. A user may make at least some of the recommended changes to the model to reduce the total ULP error.

In some embodiments, the error analysis engine may determine intermediate ULP errors at one or more boundaries within the simulation model. For example, the model may include components, such as subsystems and submodels, that establish hierarchical levels in the model. Transitions between such hierarchical levels may represent boundaries within the model. The error analysis engine may compute and present intermediate ULP errors computed for such boundaries. If the intermediate ULP error computed for the boundary of model component is large and/or unexpected, the component may be isolated from the model and subjected to further analysis. Other model boundaries at which intermediate ULP errors may be determined include boundaries between portions of a model operating at different sample times, or by data type conversions, such as Data Type Conversion block of the Simulink® simulation environment.

The systems and methods may further include an engine configured to perform critical path estimation. The engine may analyze a model and may identify the critical path through the model, e.g., the path between an input and an output having the maximum data path or propagation delay or the longest overall execution time. The error analysis engine may determine a ULP error for the critical path. The error analysis engine may present the ULP error determined for the critical path. The error analysis engine may also present intermediate ULP errors along the critical path. If the ULP error determined for the critical path is below an acceptable threshold for ULP error, one or more modifications may be made to the critical path. For example one or more model elements may be replaced with other model element that perform the same operation, but whose implementations offer lower latency, although at higher ULP error. The modifications, while raising ULP error, may make the critical path meet the timing requirement of the target device on which the algorithm of the simulation model is to be deployed.

Any path or sequence of computations that incur a certain delay or execution time may be amenable to a tradeoff between ULP error and delay or execution time. For example, there may be multiple paths of a simulation model that are close in delay or execution time. These paths may be amenable to the analysis with the display of intermediate ULP error analysis and replacement of implementations of one or more model elements on the paths with higher ULP error but lower latency. In cases where delay or execution time is stochastic, multiple paths may all be within one standard deviation in time. One or more model elements on all of these paths may be replaced with implementations offering lower latency, although higher ULP error.

The error analysis engine may include a detector configured to determine whether the simulation model will produce any special numbers at runtime. The special number detector may perform static analysis, and may determine whether non-numbers, such as positive and negative infinity (Inf) and Not a Number (NaN) values, and non-representable numbers, e.g., denormals, will occur at model runtime. The detector may report the results of its analysis of the simulation model. In response to determining that Inf/NaN values or denormals will not occur at runtime, logic for handling the occurrence of Inf/NaN values and/or denormals may be omitted. The logic may be omitted from instructions generated by a simulation environment to execute a model, from code generated and utilized by a simulation environment in an accelerated mode of execution of a model, or from standalone code generated for a model that may then be deployed on a target system or device.

The error analysis engine may interface with and support a verification and validation tool of the simulation environment. A verification and validation tool may be configured to analyze a simulation model and identify design errors. The verification and validation tool may perform test case generation from functional requirements and model coverage objectives, property proving, or dead logic detection for a simulation model. To analyze a simulation model, the verification and validation tool may convert values generated or used by the model that are in a floating point format to rational numbers. It may also approximate values that are irrational numbers, such as $\pi$ (pi), with rational numbers. The conversion of numbers in floating point format to rational numbers and the use of rational approximation may result in the verification and validation tool concluding that objectives and/or properties specified for the model are undecided or unsatisfiable. However, using NFP implementations of model elements to emulate floating-point arithmetic in a simulation model may enable the verification and validation tool to satisfy or falsify the objectives and/or properties.

After modification (if any) of the simulation model, e.g., to bring the total ULP error within an acceptable tolerance, and/or remove Inf/NaN or denormal handling logic, a code generator may generate code for the model. The code generator may generate Hardware Description Language (HDL) code that is target-independent. Removing the logic for handling Inf/NaN values or denormals can reduce the area usage of the HDL code generated for the model, thereby resulting in more efficient code. A hardware synthesis tool may utilize the generated HDL code to produce a target specific bitstream. The bitstream may be used to configure target hardware, such as a programmable logic device, to implement the procedure, e.g., the control algorithm. The configured programmable logic device may then be deployed, for example as part of an embedded system.

In some embodiments, the Inf/NaN or denormal handling logic may be retained in the model, but omitted when generating code for the model, such as HDL code or C code, among others. In other embodiments, the logic may be omitted for one or more execution modes of the model, such as an accelerated execution model and/or a rapid simulation mode.

Calculate ULP Accuracy of Model Element Types

FIG. 1 is a schematic illustration of an example test environment 100 for determining the ULP accuracy of model elements in accordance with one or more embodiments. The environment 100 may include a simulation environment 102, a code generator 104, a hardware synthesis tool 106, and a hardware platform 108. The simulation environment 102 may include a User Interface (UI) engine 110, a model editor 112, an execution engine 114, and two data stores 116 and 500. The UI engine 110 may create and present one or more User Interfaces (UIs), such as Graphical User Interfaces (GUIs) and/or Command Line Interfaces (CLIs), on a display of a workstation or other data processing device running the simulation environment 102. The one or more GUIs and/or CLIs may be operated by users to perform various simulation tasks, such as opening, creating, editing, and saving simulation models, such as an evaluation model 200. The GUIs and/or CLIs may also be used to enter commands, set values for parameters and properties, run simulation models, change model settings, etc. The simulation model editor 112 may perform selected operations, such as open, create, edit, and save, in response to user inputs.

The execution engine 114 may include an interpreter 122, a model compiler 124, and one or more solvers, such as solvers 126*a-c*. The model compiler 124 may include one or more Intermediate Representation (IR) builders, such as IR builder 128. The execution engine 114 may generate execution instructions for a simulation model, and execute, e.g., compile and run or interpret, the model. Simulation of a model may include generating and solving a set of equations, and may involve one or more of the solvers 126*a-c*. Exemplary solvers include one or more fixed-step continuous solvers, which may utilize integration techniques based on Euler's Method or Heun's Method, and one or more variable-step solvers, which may be based on the Runge-Kutta and Dormand-Prince pair.

The data store 116, which may be organized as a model element library, may store model element types of which particular ones may be selected and used to create simulation models. The data store 116 may include different implementations of model element types, including multiple implementations of the same model element type. For example, the data store 116 may include double-precision floating point implementations of model elements, as indicated at 130. The data store 116 also may include native floating point implementations of model elements, as indicated at 132. For example, for particular model element types, such as a model element that implements an Add operation, a model element that implements a Sin operation, a model element that implements a logarithmic operation, etc., there may be both a double-precision floating point implementation of that model element and a native floating point implementation of that model element. Native floating point implementations of operations performed by model elements is described in co-pending application Ser. No. 15/398,176 filed Jan. 4, 2017, which application is hereby incorporated by reference in its entirety. Native floating point is also described in the HDL Coder User's Guide (The MathWorks, Inc. © March 2018).

The data store 500 may store ULP errors determined, e.g., predetermined, for at least some of the model element types stored at the data store 116, as described herein.

The hardware platform 108 may include a programmable logic device 134, such as a Field Programmable Gate Array (FPGA). The hardware platform 108 may be coupled to simulation environment 102, which may operate the hardware platform 108 in Hardware in the Loop (HIL), as indicated by arrow 136.

The code generator 104 may generate code 138 for the evaluation model 200 or portion thereof automatically. The generated code 138 may be Hardware Description Language (HDL) code, such as VHDL code, Verilog code, SystemC code, etc. The HDL code 138 may be vendor and device independent. The hardware synthesis tool 106 may utilize the generated code 138 to configure the programmable logic device 134 at the hardware platform 108.

The simulation environment 102 may be a high-level simulation application program. Suitable high-level simulation application programs include the MATLAB® language/ programming environment and the Simulink® simulation environment from The MathWorks, Inc. of Natick, Mass., as well as the Simscape physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product from National Instruments Corp. of Austin, Tex., the Keysight VEE graphical programming environment from Keysight Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) environment, a Systems Modeling Language (SysML) environment, and the System Generator tool from Xilinx, Inc. of San Jose, Calif. Simulation models created in the high-level modeling environment 200 may be expressed at a level of abstraction that contain less implementation detail, and thus operate at a higher level than certain programming languages, such as the C, C++, C#, and SystemC programming languages.

Those skilled in the art will understand that the MATLAB language/programming environment is a math-oriented, textual programming environment for digital signal processing (DSP) design, among other uses. The Simulink simulation environment is a block diagram based design environment for modeling and simulating dynamic systems, among other uses. The MATLAB and Simulink environments provide a number of high-level features that facilitate algorithm and system development and exploration, and support simulation and model-based design, including late binding or dynamic typing, array-based operations, data type inferencing, sample time inferencing, and execution order inferencing, among others.

In some embodiments, a simulation model may be a time based block diagram. A time based block diagram may include, for example, model elements, such as blocks, connected by lines, e.g., arrows, that may represent signal values written and/or read by the model elements. A signal is a time varying quantity that may have a value at all points in time during execution of a model, for example at each simulation or time step of the model's iterative execution. A signal may have a number of attributes, such as signal name, data type, numeric type, dimensionality, complexity, sample mode, e.g., sample-based or frame-based, and sample time. The model elements may themselves consist of elemental dynamic systems, such as a differential equation system, e.g., to specify continuous-time behavior, a difference equation system, e.g., to specify discrete-time behavior, an algebraic equation system, e.g., to specify constraints, a state transition system, e.g., to specify finite state machine behavior, an event based system, e.g., to specify discrete event behavior, etc. The connections may specify input/output relations, execution dependencies, variables, e.g., to specify information shared between model elements, physical connections, e.g., to specify electrical wires, pipes with volume flow, rigid mechanical connections, etc., or storage (e.g., memory) locations, etc.

In a time based block diagram, ports may be associated with model elements. A relationship between two ports may be depicted as a line, e.g., a connector line, between the two ports. Lines may also, or alternatively, be connected to other lines, for example by creating branch points. A port may be defined by its function, such as an input port, an output port, an enable port, a trigger port, a function-call port, a publish port, a subscribe port, an exception port, an error port, a physics port, an entity flow port, a data flow port, a control flow port, etc.

Relationships between model elements may be causal and/or non-causal. For example, a model may include a continuous-time integration block that may be causally related to a data logging block by depicting a connector line to connect an output port of the continuous-time integration block to an input port of the data logging model element. Further, during execution of the model, the value stored by the continuous-time integrator may change as the current time of the execution progresses. The value of the state of the continuous-time integrator block may be available on the output port and the connection with the input port of the data logging model element may make this value available to the data logging block.

In some implementations, a model element may include or otherwise correspond to a non-causal modeling function or operation. An example of a non-causal modeling function may include a function, operation, or equation that may be executed in different fashions depending on one or more inputs, circumstances, and/or conditions. A non-causal modeling function or operation may include a function, operation, or equation that does not have a predetermined causality.

The simulation environment 102 may implement a graphical programming language having a syntax and semantics, and models may be constructed according to the syntax and semantics defined by the simulation environment 102.

Computer-based simulation models constructed within the simulation environment 102 may include textual models, graphical models, such as block diagrams, and combinations thereof. A model may be a high-level functional or behavioral model. A model may be executed in order to simulate the system being modeled, and the execution of a model may be referred to as simulating the model. For example, a model editor window presented on a display may include a Run command button that may be selected by a user to execute a model. Alternatively, a user may enter a run command in a CLI. In response to the user selecting the Run button or entering the run command, the simulation engine 410 may execute the model, and may present the results of the model's execution to the user, e.g., on the model editor window or some other display.

Simulation may refer to generating a behavior where a behavior may be a sequence of ordered values. The ordering may be on different domains, such as integers or real numbers, and the domain may represent physical quantities such as time.

Exemplary simulation models include Simulink models, MATLAB models, Simscape models, Stateflow models, Modelica models, Unified Modeling Language (UML) models, LabVIEW block diagrams, MatrixX models, and Agilent VEE diagrams, and combinations thereof.

Exemplary code generators include the Simulink HDL Coder, the Simulink Coder, the Embedded Coder, and the Simulink PLC Coder products from The MathWorks, Inc. of Natick, Mass., and the TargetLink product from dSpace GmbH of Paderborn Germany. Exemplary code that may be generated includes textual source code compatible with a programming language, such as the C, C++, C#, Ada, Structured Text, Fortran, and MATLAB languages, among others. Alternatively or additionally, the generated code may be in the form of object code or machine instructions, such as an executable, suitable for execution by a target device, such as a central processing unit (CPU), a microprocessor, a digital signal processor, etc. The generated code may be in the form of a hardware description, for example, a Hardware Description Language (HDL), such as VHDL, Verilog, a netlist, or a Register Transfer Level (RTL) description. The hardware description may be utilized by one or more synthesis tools to configure a programmable hardware device, such as Programmable Logic Devices (PLDs), Field Programmable Gate Arrays (FPGAs), and Application Specific Integrated Circuits (ASICs), among others. The generated code may be stored in memory, such as a main memory or persistent memory or storage.

Exemplary hardware synthesis tools include the Design Compiler from Synopsys, Inc. of Mountain View, Calif., the Encounter RTL Compiler from Cadence Design Systems, Inc. of Mountain View, Calif., Quartus from Intel Corp. of Santa Clara, Calif., Precision RTL from Mentor Graphics of Wilsonville, Oreg., and Vivado Design Suite from Xilinx, Inc. of San Jose, Calif., among others.

Simulation models may be created and run to simulate the behavior of communication systems, signal processing systems, control systems, such as motor controllers, vision systems, and factory automation systems, among other physical, real-world systems.

Figure 2:
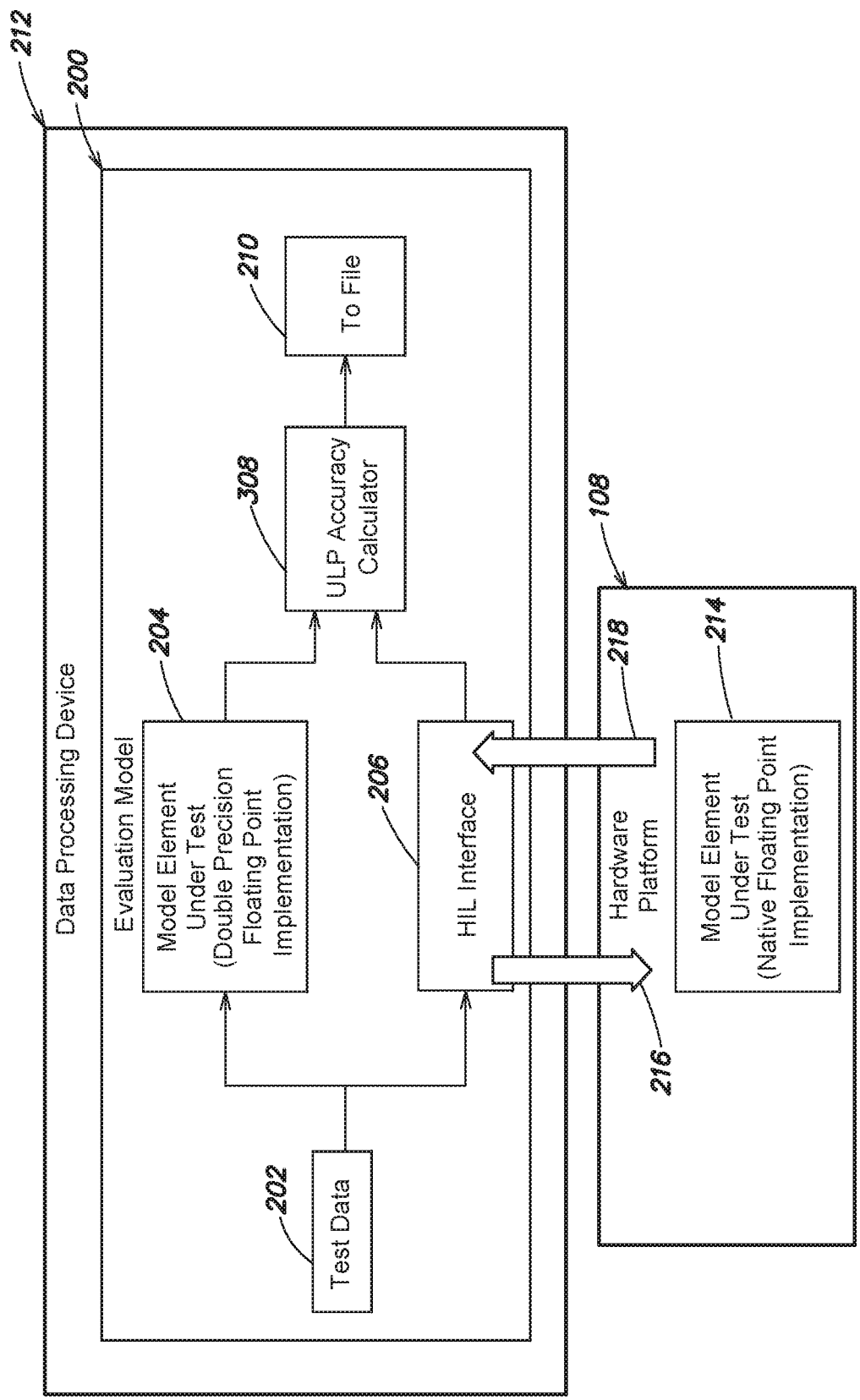
FIG. 2 is a schematic illustration of an example evaluation model in accordance with one or more embodiments.

FIG. 2 is a schematic illustration of an example of the evaluation model 200 in accordance with one or more embodiments. The model 200 may include a test data element 202, a model element under test element 204, a Hardware in the Loop (HIL) interface element 206, a ULP accuracy calculator element 208, and a To File element 210. The evaluation model 200 may be executed by the simulation environment 102, which may be running on a data processing device 212. The data processing device 212 may be a workstation having a Central Processing Unit (CPU) that supports floating point arithmetic, for example through a floating-point unit (FPU) and/or math coprocessor. The programmable logic device 134 of the hardware platform 108 may be configured with a hardware implementation of a model element 214 that performs the same operation as model element 204. However, while the model element 204 is a double-precision floating point implementation, the model element 214 is a native floating point implementation translated into HDL code and implemented in hardware, e.g., an FPGA. In some embodiments, the FPGA may be a coprocessor, similar to a floating point unit.

For example, suppose the evaluation model 200 is being used to determine the ULP accuracy of a model element implementing a logarithmic operation. The double-precision floating point implementation of the logarithmic model element from the library 130 may be inserted in the evaluation model at the model element under test 204. The code generator 104 may generate HDL code for the native floating point implementation of the logarithmic model element from the library 132. The hardware synthesis tool 106 may use the HDL to configure the programmable logic device 134. During execution of the evaluation model 200, the test data element 202 may source the same test data to both the model element under test 204, e.g., the double-precision floating implementation of the logarithmic model element, and the HIL interface element 206. The HIL interface element 206, which communicates with the hardware platform 108, may provide the test data to the model element under test implemented at the programmable logic device 134 of the hardware platform 108, as indicated by arrow 216.

The model element under test 204 performs the logarithmic operation on the test data, using its double precision floating-point implementation, and provides its computed result to the ULP accuracy calculator element 208. The datatype of the computed result may be double-precision floating point. Likewise, the model element under test 214 performs the logarithmic operation on the test data, using its native floating point implementation, and provides its computed result to the HIL interface model element 206 as indicated at arrow 218, which then provides the computed result to the ULP accuracy calculator element 208. The datatype of the computed result output by the HIL interface model element 206 also may be double-precision floating point. The ULP accuracy calculator compares the two results and determines a ULP error (or accuracy) value for the native floating point implementation of the logarithmic model element based on that comparison. The ULP accuracy calculator provides the determined ULP error to the To File model element 210, which is configured to write the ULP error to the ULP errors data store 500.

In some embodiments, the test data 202 may include the entire range of floating point numbers. In other embodiments, the test data 202 may include a randomized set of mantissa values over the entire range or a subrange of exponent values.

FIG. 3 is an example code listing 300 of a function performed by the ULP accuracy calculator model element 208 in accordance with one or more embodiments. As indicated at line 1, the code listing 300 is a function definition written in the MATLAB programming language. The function is called 'ulpErrorCompute', and takes the variables 'result' and 'expResult' as input arguments and computes the variable 'err' as an output argument. The input argument 'result' is the computation result produced by the double-precision floating implementation of the model element being evaluated, e.g., model element 204 (FIG. 2). The input argument 'expResult' is the computation result produced by the native floating point implementation of the model element in hardware, e.g., model element 214. The function computes the ULP error of the native floating point implementation of the model element.

As indicated at lines 2 and 3, the 'result' and 'expResult' input arguments are converted from double precision floating-point data types to 64-bit integer data types. At line 4 it is determined whether the 'result' and 'expResult' input arguments have the same sign. At line 5, a check is performed to determine whether the two numbers have the same sign. If so, at line 6, the ULP error (err) is calculated as the absolute value of the difference between the two numbers (as integers). Else, at lines 7 and 8, the numbers have different signs, and the ULP error (err) is calculated by adding the absolute values of the two numbers (as integers).

It should be understood that the code listing 300 is for purposes of explanation, and that other code and/or functions may be used. In some embodiments, the function may convert the input arguments 'result' and 'expResult' to fixed-point numeric objects, for example using the MATLAB 'fi' constructor function. If the values for 'result' and 'expResult' are single precision floating-point data types, then they may be converted to 32-bit integer data types. Additionally, the model element under test 204 may use other implementations besides double-precision floating point implementations. For example, the model element under test 204 may alternatively utilize a half-precision floating point implementation, a single-precision floating point implementation, a quadruple-precision floating point implementation, an octuple-precision floating point implementation, or an extended-precision floating point implementation, among others. An extended-precision floating point implementation may include a floating point data type having a number of bits that is not a power of two, such as 40-bit, 80-bit, etc.

If the native floating point implementation running in hardware, as indicated at the model element 214, computes the same result as the double-precision floating point implementation, as indicated at model element 204, the ULP accuracy calculator 208 may determine that the ULP error (or accuracy) for that native floating point model element is zero. If the native floating point implementation computes results that differ from the results computed as the double-precision floating point implementation, then ULP accuracy calculator determines a positive integer value as the ULP error for the native floating point model element.

Figure 4:
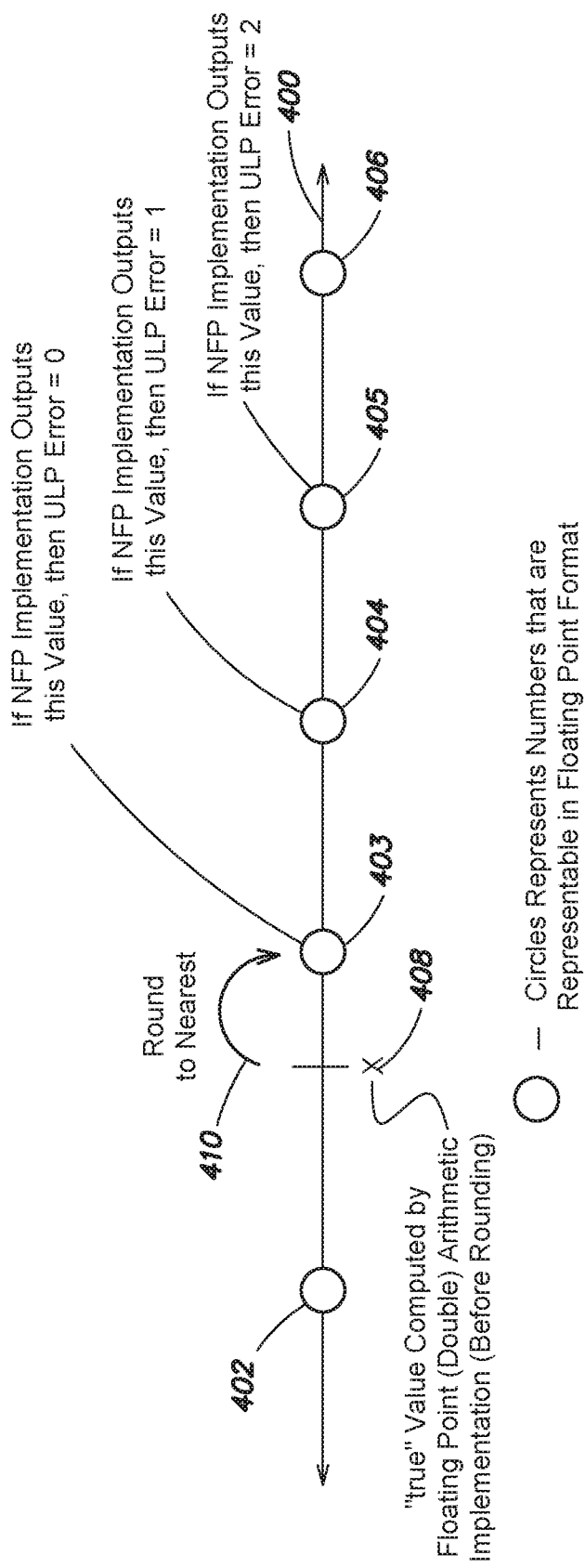
FIG. 4 is a schematic illustration of a number line used for explaining the determination of ULP error values for model elements.

FIG. 4 is a schematic illustration of a number line 400 to explain the determination of ULP accuracy for model elements. Like all numeric representations used by computers, even double precision floating point format can only represent a finite set of numbers. Circles 402-406 along the number line 400 represent a sequence of values that can be represented in double precision floating-point format. The spaces in between the circles 402-406 represent numbers that cannot be represented in double precision floating-point format. A given operation may compute an ideal (infinitely precise) result X indicated at 408, which may not be a value that can be represented in double-precision floating-point format. Applying the round to nearest rounding mode as indicated at 410 the result X may be rounded to the value represented by the circle 403, which value may then be output as the result of the operation.

Suppose the result produced by the HIL testing of the NFP implementation of that same operation is the value represented by the circle 403. In this case, the evaluation model 200 may determine that the ULP accuracy of this operation is zero. If the result produced by the HIL testing is the value represented by the circle 404, the evaluation model 200 may determine that the ULP accuracy of the operation is 1, since it is one floating point number representation away from the result computed by the operation implemented with double precision floating-point arithmetic. If the result is the value represented by the circle 405, the evaluation model 200 may determine that the ULP accuracy of the operation is 2, and so on. In other words, if the result produced by the HIL testing is the same as applying the round to nearest rounding mode, then the ULP error is zero. Otherwise, the ULP error is some positive value. If the result of the HIL testing is the value represented by the circle 402, the ULP accuracy of the operation is also 1.

In some embodiments, the output computed by the double-precision floating point implementation of a model element is considered to be the true and accurate result of the operation being evaluated. As noted, in other embodiments, other implementations, such as a quadruple precision floating-point implementation, among others, may be used instead of double-precision.

Different implementations may be available for some of the model element types supported by the simulation environment 102. For example, different native floating point implementations may be available. The different implementations may have different architectures. For example, multiple implementations may be provided for performing a logarithmic operation. One implementation may use an iterative architecture to perform the logarithmic operation. Another implementation may use a polynomial approximation. In addition, different implementations may be provided that are optimized for different performance attributes. For example, one implementation of an adder operation may be optimized for speed when implemented in hardware, while another implementation may be optimized for area usage. Each of these different implementations for a given operation may be tested to determine their respective ULP error. For a given operation, the different implementations may have different ULP errors.

This process may be performed for all of the model elements in the native floating point library 132, e.g., all model elements for which there is one or more native floating implementation. The determined ULP errors may be stored in the data store 500 for each implementation. It should be understood that the ULP error computed for each implementation of a model element is hardware independent.

The data store 500 that contains determined ULP errors for model elements may be implemented through one or more data structures, such as linked lists, tables, databases, etc. stored in memory.

It should be understood that other techniques may be used to determine the ULP error of model element types. For example, in other embodiments, the ULP error for a given model element may be determined entirely in software. For example, a simulation model may be created having a floating point implementation of a given model element and a native floating point implementation of the given model element. The simulation model may be run on a data processing device, such as a workstation or server. During execution of the simulation model, sample input data may be provided to the two model elements, and the outputs computed by the two model elements may be compared to compute the ULP error.

Figure 5:
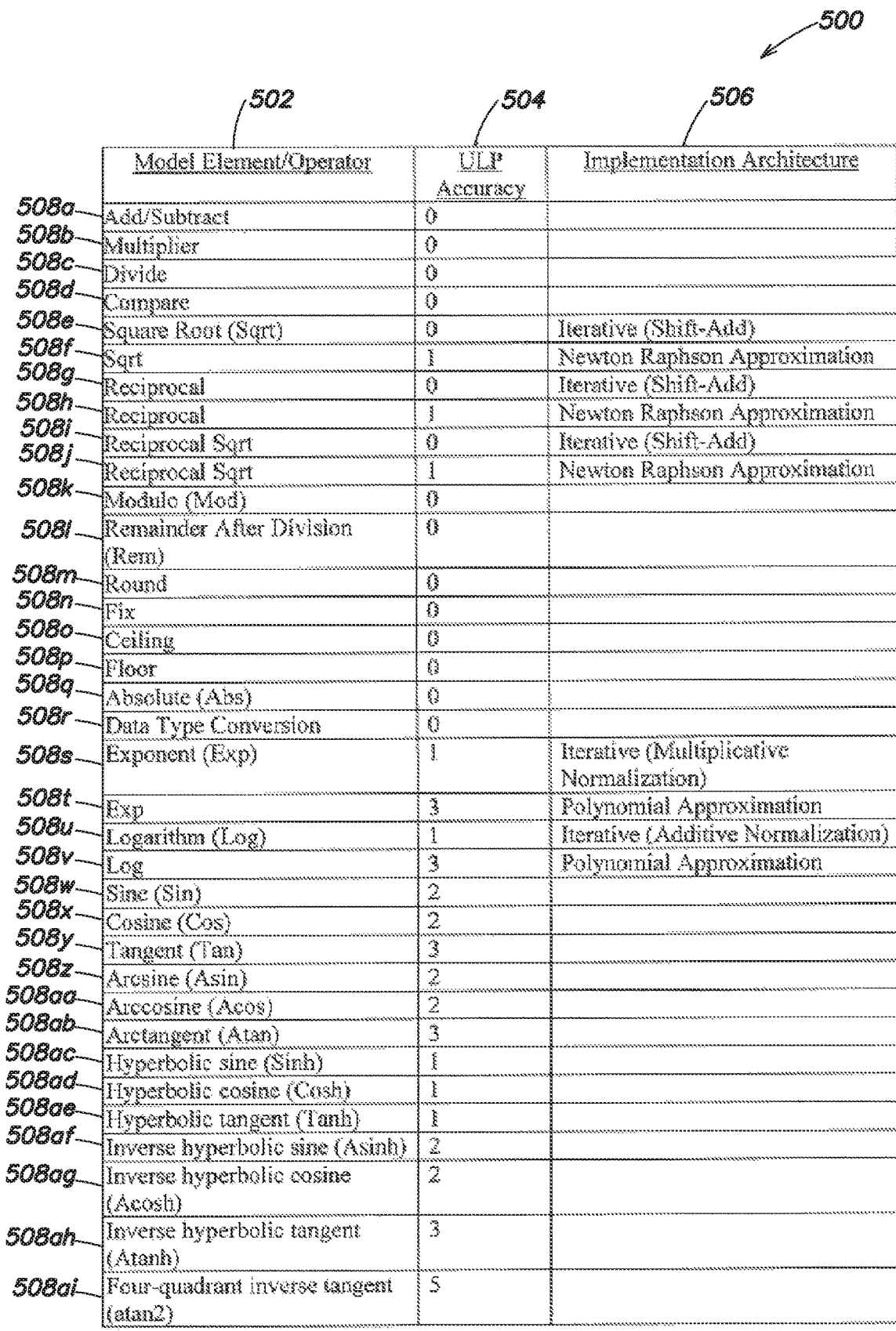
FIG. 5 is a schematic illustration an example data store containing ULP error values determined for model elements in accordance with one or more embodiments.

FIG. 5 is a schematic illustration an example of the data store 500 in accordance with one or more embodiments. The data store 500 may be organized as a table having a plurality of columns and rows defining records or cells for storing information. For example, the data store 500 may have a model element (e.g., operator) column 502, a ULP accuracy column 504, and an implementation architecture column 506. The data store 500 may also include a plurality of rows, such as rows 508a-ai. Each row may correspond to a particular type of model element (e.g., operator) and separate rows with different ULP error values may be provided for model elements having different implementation architectures. For example, for a Reciprocal Sqrt operation, there may be two implementations available. One implementation, which uses an iterative (shift-add) implementation, has a ULP error of 0, as indicated at row 508i, while another implementation, which uses a Newton Raphson approximation, has a ULP error of 1, as indicated at row 508*j*.

Measuring Rounding and Numerical Computation Errors in Terms of ULP

With ULP errors determined for model element types and stored at the data store 500, a user's simulation model may be evaluated to measure its total error in terms of ULP. In some embodiments, total ULP error of a model may be the largest ULP error determined at an output port of the model. In addition, total ULP error may refer to the ULP error determined along any path in a model. The total ULP error may refer to the ULP error determined on paths in a model that have particular characteristics. For example, a path with uniform sample time, such as the fastest sample time, or paths within a subsystem that is prepared for code generation (e.g., by having certain parameters such as code reuse set). Model elements/blocks/operations that are only used for display (e.g., connected to and including Scope blocks) may be removed from the ULP analysis.

Figure 6:
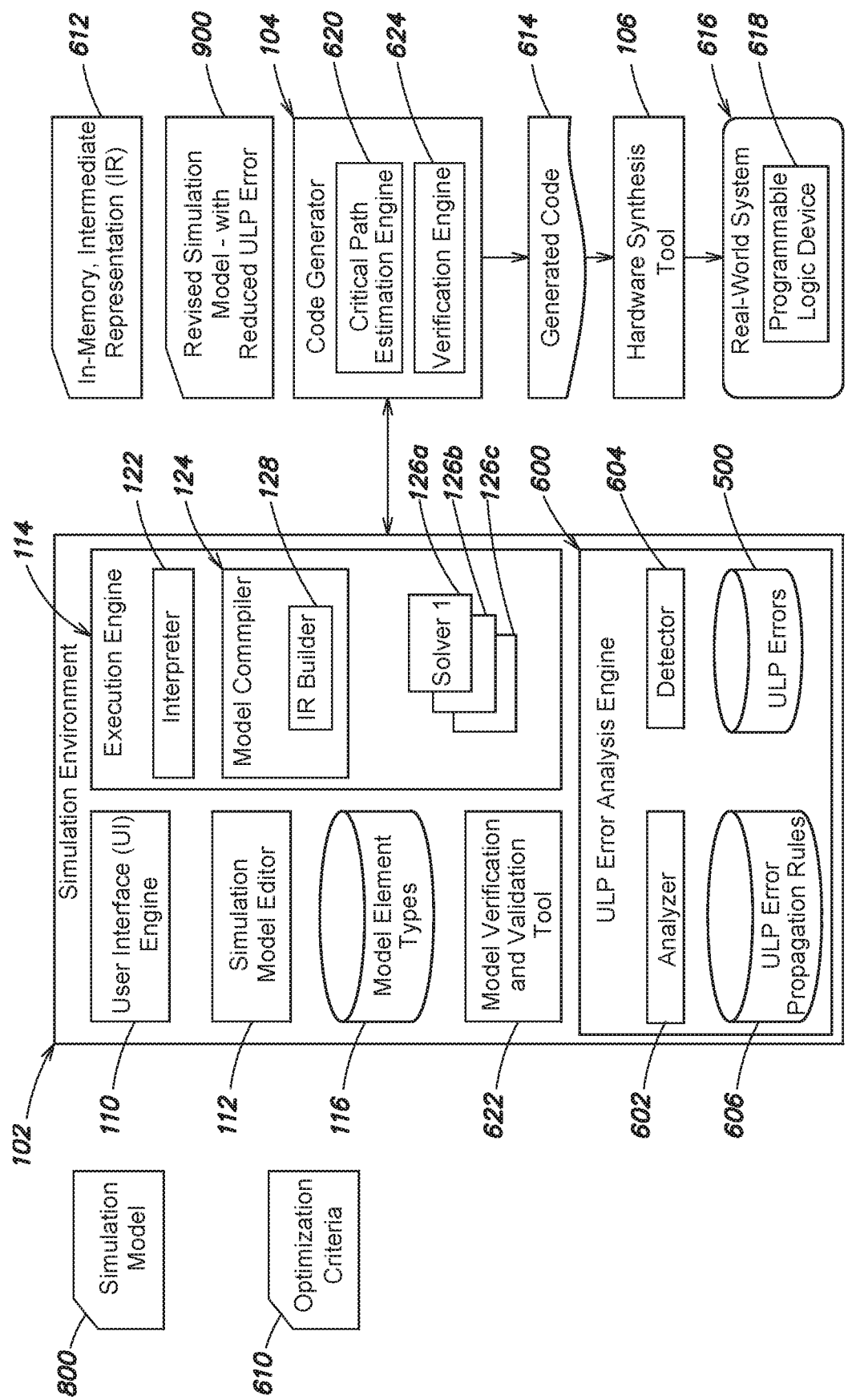
FIG. 6 is a schematic illustration of an example engine for performing ULP error analysis on a simulation model in accordance with one or more embodiments.

FIG. 6 is a schematic illustration of an example engine 600 for performing ULP error analysis on a user's simulation model in accordance with one or more embodiments. The ULP error analysis engine 600 may include an analyzer 602 configured to analyze the user's model, a detector 604 configured to determine whether or not the user's model will produce any special numbers at runtime. The analysis of the model, and the detection of special numbers may be performed statically, and may not require model execution. The ULP error analysis engine 600 may also include or have access to a data store 606 that contains rules specifying how model elements propagate ULP errors. For example, there may be a number of rules by which model elements, when included in a simulation model, propagate ULP errors. Exemplary rules are described herein. The data store 606 may include a mapping of model elements to the rules specifying how the model elements propagate ULP errors. The ULP error analysis engine 600 also may include or have access to the data store 500 that includes the ULP errors determined for model element types as described.

The ULP error analysis engine 600 and/or one or more of the parts thereof may be implemented through one or more software modules containing program instructions pertaining to the methods described herein. The software modules may be stored in a memory, such as a main memory, a persistent memory and/or a computer readable medium, of a workstation, server, or other data processing machine or device. The program instructions may be executed by one or more processors. Other computer readable media may also be used to store and execute these program instructions, such as non-transitory computer readable media, including optical, magnetic, or magneto-optical media. In other embodiments, the ULP error analysis engine 600 and/or one or more of the parts thereof may comprise hardware registers and combinatorial logic configured and arranged to produce sequential logic circuits that implement the methods described herein. In still other embodiments, various combinations of software and hardware, including firmware, may be utilized to implement the described methods.

As illustrated in FIG. 6, the ULP error analysis engine 600 may be included in the simulation environment 102. In other embodiments, the ULP error analysis engine 600 and/or one or more parts thereof may be separate from the simulation environment 102. In such cases, the ULP error analysis engine 600 may communicate with the simulation environment 102 via a bus or network, e.g., through local procedure calls (LPCs), remote procedure calls (RPCs), an Application Programming Interface (API), or another communication or interface technology.

Figure 7A:
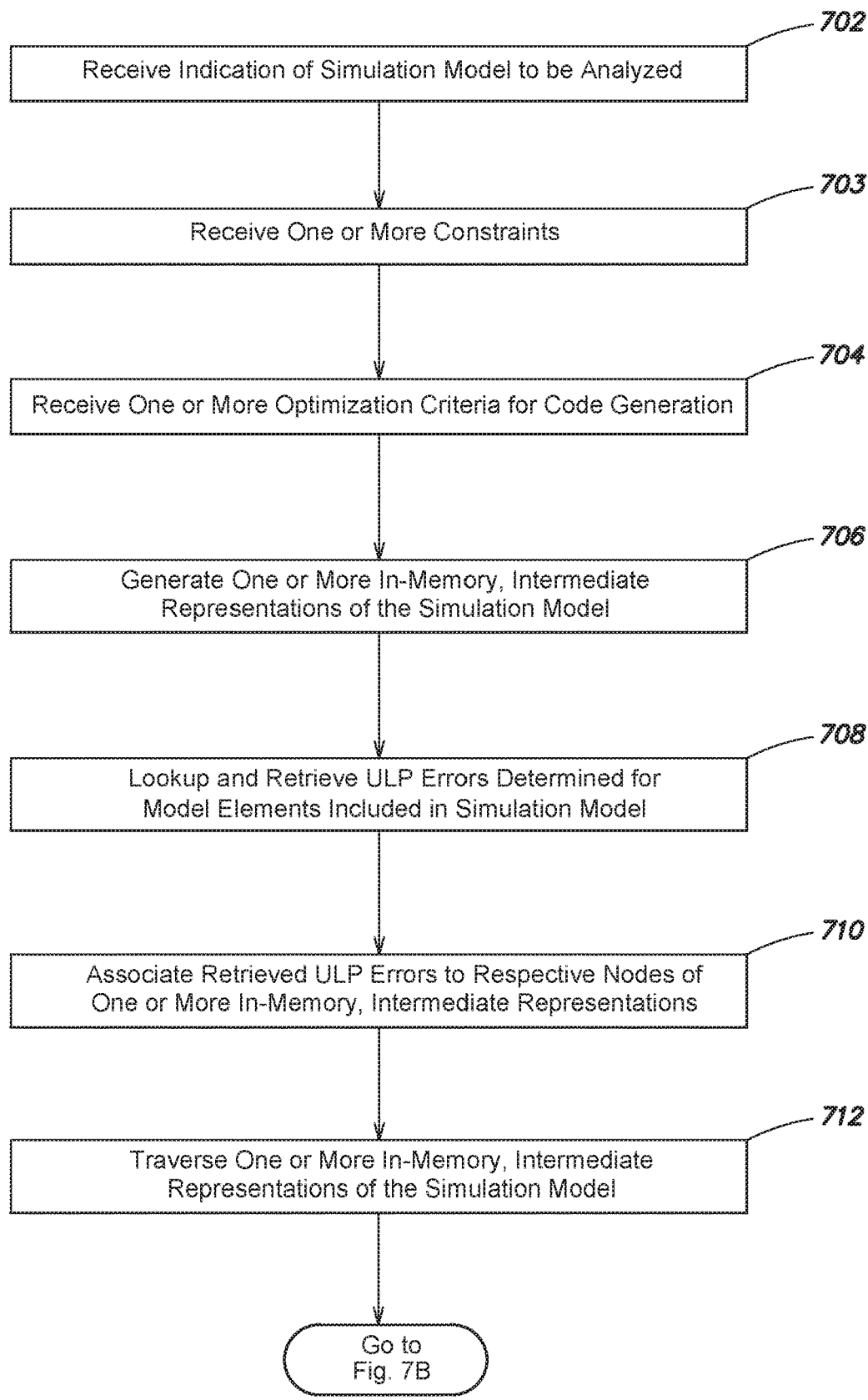
FIGS. 7A-C are partial views of a flow diagram of an example method in accordance with one or more embodiments.
Figure 7B:
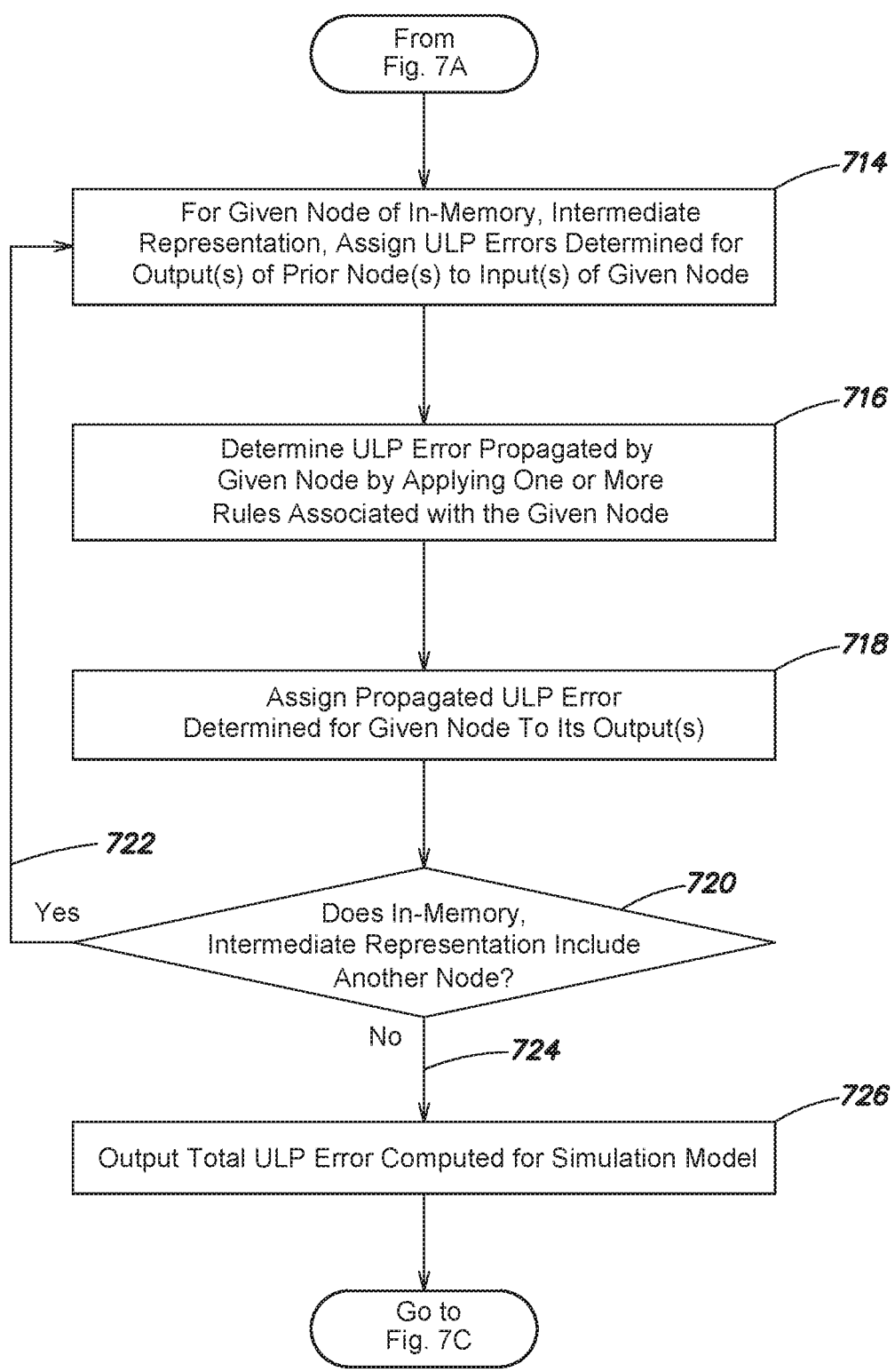
Figure 7C:
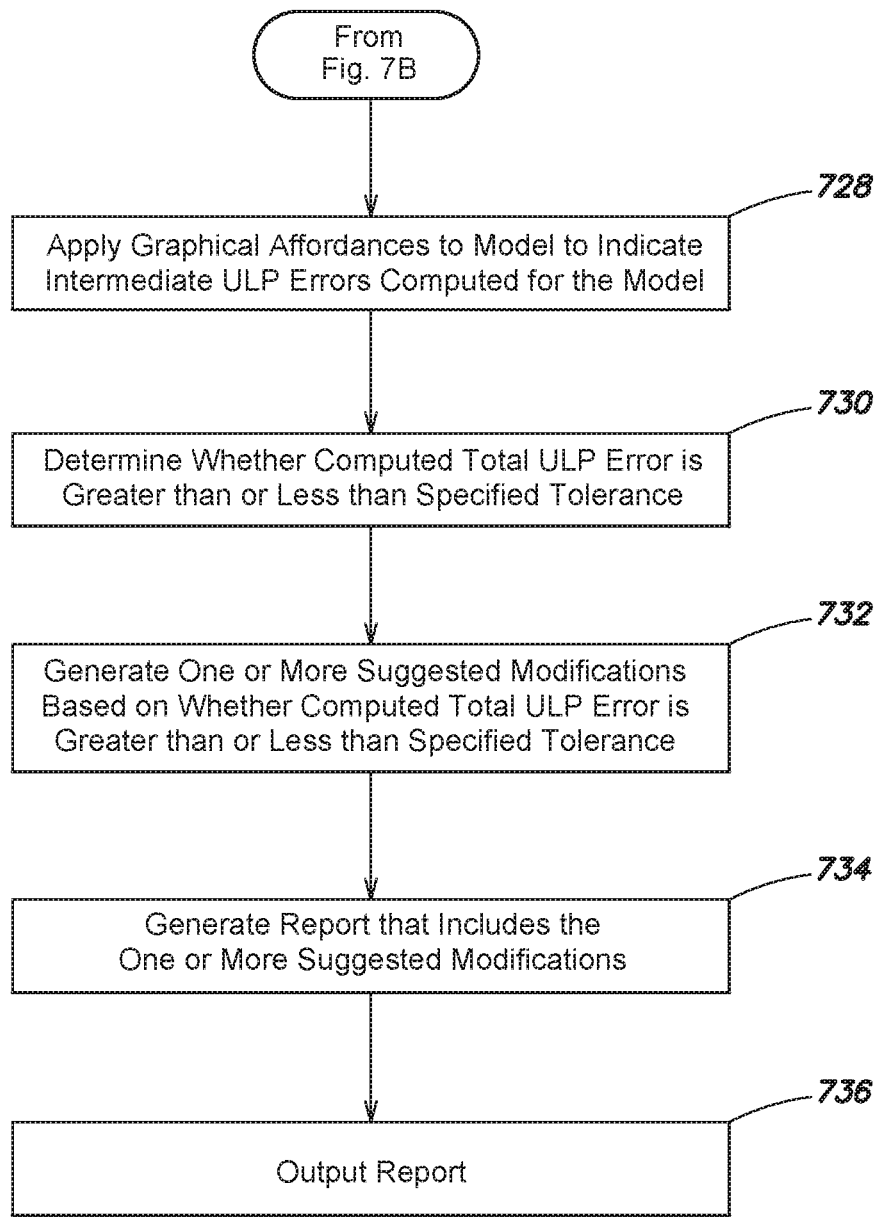

FIGS. 7A-C are partial views of a flow diagram of an example method in accordance with one or more embodiments. It should be understood that the flow diagrams described herein are representative only. In some embodiments, one or more steps may be omitted, one or more steps may be optionally performed, multiple steps may be combined or consolidated, additional steps may be added, the order of steps may be changed, and/or one or more sequences indicated by the arrows may be omitted.

A simulation model 800 (FIG. 6), or a portion thereof, may be received by or identified to the ULP error analysis engine 600, as indicated at block 702. For example, the simulation model 800 may be opened or created in the simulation environment 102. The ULP error analysis engine 600 also may receive one or more constraints, such as one or more error tolerance values, e.g., as specified by a user, as indicated at block 703. The ULP error analysis engine 600 may also access one or more optimization criteria 610 specified for the model 800, as indicated at block 704. The one or more optimization criteria 610 may control how code, such as HDL code, will be generated for the model 800. For example, there may be options available in the code generation process, and these options may be set to desired values. Exemplary optimization criteria include whether to:

include denormal handling logic;

include Inf/NaN handling logic;

apply strict rounding, i.e., round to nearest, ties to even, as required by the IEEE 754 standard, or a relaxed rounding method;

utilize hardware efficient implementations of transcendental operators, even though these implementations may have higher ULP errors;

use radix choices for iterative algorithms;

reduce multiplication by using higher-precisions shift-add logic; and increase or decrease precision of integer-based algorithmic implementations based on a user-specified ULP requirement.

If the denormal handling logic criteria is set to On, then the code generator 104 may insert logic in the generated code for the model. The logic may count the number of leading zeros of denormal values and perform a left shift operation to obtain a normalized representation of the denormal values for subsequent processing. Inserting denormal handling logic in the generated code, increases the area usage on the target device. It may also affect timing.

If the Inf/NaN handling logic criteria is set to On, then the code generator 104 may insert logic in the generated code for detecting and reporting the occurrence of Inf and NaN values. As with denormal handling logic, inserting Inf/NaN handling logic increases the area usage on the target device.

If the relaxed rounding criteria is set to On, then the code generator 104 may utilize hardware implementations of model elements that apply a rounding mode other than round to nearest, ties to even. Exemplary relaxed rounding modes include Zero, which rounds to the nearest representable number in the direction of zero, Floor, which rounds to the nearest representable number in the direction of negative infinity, and Ceiling, which rounds to the nearest representable number in the direction of positive infinity. Implementations that apply a different rounding mode may execute faster, use less area, and/or require less power when implemented in hardware.

If the utilize hardware efficient implementations of transcendental operations criteria is set to On, then the code generator 104 may replace model elements that perform transcendental operations with hardware efficient implementations.

The use radix choices for iterative algorithms criteria applies different implementations of Divide and Reciprocal model elements. There may be two settings: Radix-2 and Radix-4. The Radix-2 mode, which may be the default mode, performs repeated subtractions by computing one bit of the quotient in each iteration. It may result in lower area usage, but higher latency. The Radix-4 mode may perform repeated subtractions by computing two bits of the quotient in each iteration. This requires half the number of iterations as the Radix-2 mode thus lowering the latency, but has a higher area usage.

If the reduce multiplication by using higher-precisions shift-add logic criteria is set to On, then the code generator 104 may convert constant multipliers, such as gain operations, into shifts and adds using canonical signed digit (CSD) techniques. This may reduce the area usage of a hardware implementation of such multipliers.

If the increase or decrease precision of integer-based algorithmic implementations based on a user-specified ULP requirement criteria is set to On, then the code generator 104 may increase precision, e.g., by changing to an integer data type having more bits, and decrease precision, e.g., by changing to an integer data type having fewer bits.

The IR builder 128 of the model compiler 124 may generate one or more in-memory, intermediate representations (IRs) 612 for the simulation model 800, as indicated at block 706. For example, the model compiler 124 may apply elaboration, lowering, and/or optimization procedures resulting the in the creation of the one or more IRs 612. The one or more IRs 612 may be graph-based, object-oriented structures. For example, the one or more of the IRs may be in the form of a hierarchical, Data Flow Graph (DFG), a Control Flow Graph (CFG), Control Data Flow Graph (CDFG), a Parallel Intermediate Representation (PIR), a program structure tree (PST), an abstract syntax tree (AST), etc. The one or more IRs may include IR objects, namely nodes interconnected by edges. The nodes may represent model elements, e.g., blocks, of the model 800 or portions thereof in an abstract manner. For example, one or more nodes of the IR may represent a given model element. The edges may represent the relationships, e.g., connections, among the blocks of the model 800. Each block of the model 800 may map to one or more nodes of the IR, and each relationship among the blocks may map to one or more edges of the IR. In some implementations, the one or more IRs 612 may have serial and/or parallel structures, for example to support the generation of serial or parallel code. The one or more IRs 612 may be saved to memory, such as a main memory or a persistent memory of a data processing device.

The analyzer 602 may analyze the one or more IRs 612, and compute a total error for the simulation model 800 in terms of ULP. The analyzer 602 may perform a lookup on the data store 500, and retrieve the ULP errors determined for the blocks that are included in the model 800, as indicated at block 708. The analyzer 602 may associate the ULP errors retrieved from the data store 500 with the nodes of the one or more IRs 612 that correspond to those respective model elements, as indicated at block 710. The analyzer 602 may traverse the one or more IRs 612 following the control and/or data dependencies between the nodes as established by the edges, as indicated at block 712. For example, the one or more IRs 612 may represent directed acyclic graphs (DAGs), and the analyzer 602 may perform a graph traversal on the DAGs, starting with the nodes representing the top-level inputs to the model 800.

As the analyzer 602 reaches a given node of the one or more IRs 612 during the graph traversal, it may assign the ULP errors determined for the outputs of the prior node of the graph to the inputs of the given node, as indicated at block 714 (FIG. 7B). The analyzer 602 may then determine the ULP error propagated by the given node by applying the one or more rules associated with the given node, as indicated at block 716. The ULP error propagated by the given node may be a function of the ULP error(s) at the input(s) of the given node, and the predetermined ULP error introduced by the model element corresponding to the given node. The analyzer 602 may assign the propagated ULP error value to the output(s) of the given node, as indicated at block 718.

The analyzer 602 may determine whether the graph includes another node to be analyzed, as indicated at decision step 720. If so, processing may return to block 714, as indicated by Yes arrow 722. Returning to decision step 720, if the analyzer 602 determines that all nodes of the graph have been processed, the ULP error analysis engine 600 may output the computed total ULP error for the model, as indicated by No arrow 724 leading to block 726. If the model 800 includes more than one output, a total ULP value may be computed for each such output. In some embodiments, the ULP error analysis engine 600 may apply one or more graphical affordances to a visual representation of the model that indicate intermediate ULP error values computed for the model, as indicated at block 728 (FIG. 7C). For example, the ULP error analysis engine 602 may direct the UI engine 110 to present one or more popup windows on a visual presentation of the model 800. The popup windows may be located at inputs or outputs of model elements, and present the intermediate ULP errors computed for those inputs or outputs.

The analyzer 602 may compare the computed total ULP error to the received tolerance to determine whether the computed total ULP error exceeds or falls below the tolerance, as indicated at block 730. The ULP error analysis engine 600 may generate one or more suggested modifications to the model based on whether the computed total ULP error was determined to exceed or fall below the tolerance, as indicated at block 732. For example, if the computed total ULP error exceeds the tolerance, the engine 600 may utilize the information in the data store 500 to identify model elements having high ULP errors. If the computed total ULP error falls below the tolerance, the engine 600 may suggest reducing the floating point precision of the model. The engine 600 may generate one or more reports that may include the computed total ULP error and the one or more suggested modifications, among other information, as indicated at block 734. The engine 600 may output the report, for example it may display the report on a display of a workstation, transmit the report, print the report, etc., as indicated at step 736.

Two rules that may be applied by the analyzer 602 are:
1. If ULP error of Input(s) to Operation is Zero, ULP error Propagated by Operation Equals ULP error determined for Operation
2. If ULP error determined for Operation is Zero, ULP error Propagated by Operation is Function of ULP errors of Input(s)

The application of these rules may be described in connection with a simulation model.

For purposes of explanation, the present disclosure may make reference to visual depictions of simulation models. Nonetheless, it should be understood that the ULP error analysis engine 600 may operate on one or more IRs constructed for the model. The one or more IRs may be stored in the memory of a data processing device, e.g., as one or more data structures.

Figure 8:
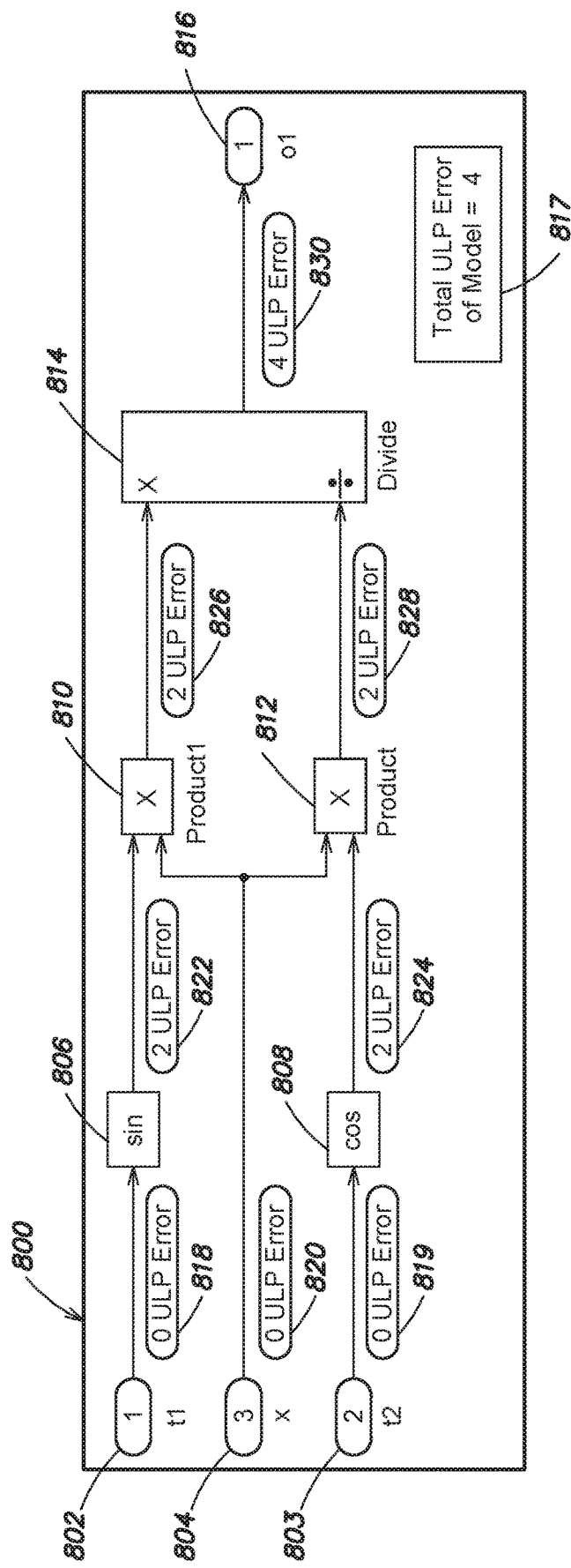
FIG. 8 is an illustration of an example simulation model in accordance with one or more embodiments.

FIG. 8 is an illustration of an example visual representation of the simulation model 800. The model 800 includes three Inport blocks 802-804 named t1, t2, and X, respectively, a Sine block 806 named 'Sin', a Cosine block 808 named 'Cos', two Product blocks 810 and 812 named 'Product1' and 'Product', respectively, a Divide block 814 named 'Divide', and an Outport block 816 named 'o1'. The model compiler 124 may generate one or more in-memory, intermediate representations (IRs) for the model 800, and the analyzer 602 may analyze these IRs to calculate how the ULP errors propagate through the model 800. Suppose the ULP errors determined for all of the blocks of the model are zero, except for the Sin and Cos blocks 806 and 808, which have ULP errors of two. The analyzer 602 may determine that the ULP errors for the outputs of the Inport blocks 802-804, which themselves have zero ULP error, are all zero. When the analyzer 602 reaches the one or more nodes of the IR that represent the Sin block, it may determine that the ULP error of the input to the Sin block 806, which is the output of the t1 Inport block 802 is zero, but that the Sin block 806 has a ULP error two. Applying rule 1. above, the analyzer 602 may compute a ULP error of two for the output of the Sin block 806. In a similar manner, the analyzer 602 may compute a ULP error of two for the output of the Cos block 808.

When the analyzer 602 reaches the node of the IR for the Product block 810, it may determine that the ULP error on one of the inputs, e.g., the input from the Sin block 806 is two, while the ULP error on the other input, e.g., the input from the X Inport block 804 is zero. The analyzer 602 may also determine that the ULP error of a Product block, such as the Product block 810 is zero. Applying rule 2. above, the analyzer 806 may determine that the function for determining the ULP error propagated by a Product block the sum of the ULP errors to the inputs of the Product block. Applying this function, the analyzer 602 may compute a ULP error of two for the output of the Product block 810. In a similar manner, the analyzer 602 may compute a ULP error of two for the output of the Product block 812.

When the analyzer 602 reaches the node of the IR for the Divide block 814, it may determine that the ULP error on each of its two inputs is two, i.e., the ULP errors propagated by the two Product blocks 810 and 812. The analyzer 602 also may determine that the ULP error of a Divide block is zero. Applying rule 2. above, the analyzer 602 may determine that the function for determining the ULP error propagated by a Divide block is the sum of the ULP errors at the inputs to the Divide block. Applying this function, the analyzer 602 may compute a ULP error of four for the output of the Divide block 814.

When the analyzer 602 reaches the node of the IR for the Outport block 816, it may determine that the ULP error on its input is four, and that the ULP error determined for an Outport block is zero. The node of the IR for the Outport block 816 may be the last node of the IR, since there are no other blocks in the model having a data dependency on the Outport block 816. Accordingly, the analyzer 602 may direct the UI engine 110 to output a total ULP error for the model 800 of four. For example, the UI engine 110 may present a dialog window 817 that indicates the total ULP error computed for the simulation model 800, e.g., four.

Suppose the user concludes that a ULP error of four for the simulation model 800 is not acceptable. To assist the user in understanding how the ULP errors arise and accumulate in the model 800, the ULP error analysis engine 600 may direct the UI engine 110 to present graphical affordances, such as popup windows, that include at least some of the intermediate ULP errors calculated by the engine 600 in a visual presentation of the model 800. By reviewing the information presented in these popup windows, the user may better understand where ULP errors are being introduced in the model. This information may lead the user to modify the model in order to reduce or eliminate the ULP errors.

For example, referring to FIG. 8, the UI engine 110 may annotate each of the Inport blocks 802-804 with respective popup windows 818-820 that indicate ULP errors of zero propagated by the Inport blocks 802-804. The UI engine 110 may annotate the Sin and Cos blocks 806 and 808 with respective popup windows 822 and 824 that indicate ULP errors of two being propagated by the Sin and Cos blocks 806 and 808, respectively. The UI engine 110 may annotate the Product blocks 810 and 812 with respective popup windows 826 and 828 that indicate ULP errors or two being propagated by the Product blocks 810 and 812. The UI engine 110 may annotate the Divide block 814 with a popup window 830 that indicates a ULP error of four being propagated by the Divide block 814. By reviewing the information in the popup windows, the user may understand that the Sin and Cos blocks 806 and 808, respectively, are the source of ULP error in the model 800. In addition, the user may understand that the Product and Divide blocks 810, 812, 814 accumulate the ULP error introduced by the Sin and Cos blocks 806 and 808, respectively.

It should be understood that the UI engine 110 may use other graphical affordances to present intermediate ULP error values.

Reducing ULP Error

The user may choose to edit the model 800 to reduce or eliminate the ULP error. For example, the user may choose to replace the Sin and Cos blocks 806 and 808 with blocks that approximate the Sin and Cos operations, and have lower ULP error.

Figure 9:
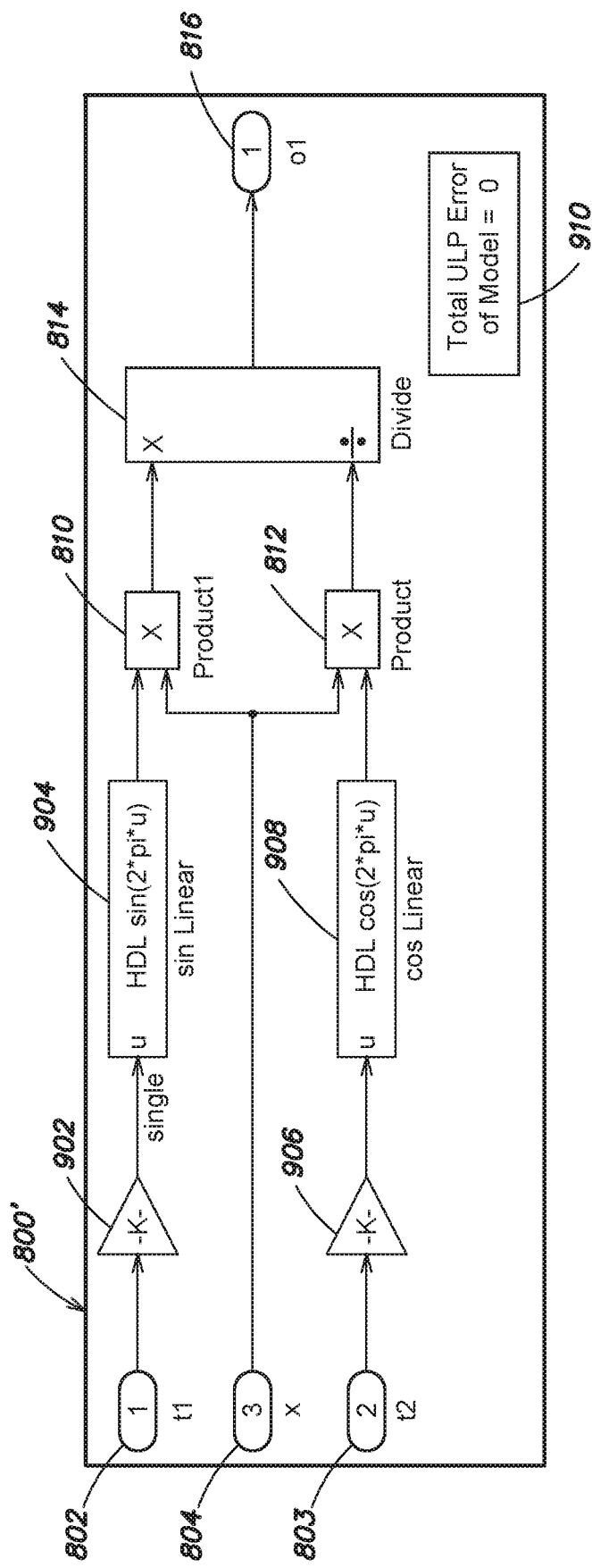
FIG. 9 is an illustration of a modified version of the example simulation model of FIG. 8.

FIG. 9 is an illustration of an example modified version of the simulation model shown in FIG. 8 indicated at 800'. Like the simulation model 800, the modified model 800' may include the Inport blocks 802-804, the Product blocks 810 and 812, the Divide block 814, and the Outport block 816. However, the modified model 800' may include blocks that implement linear functions to approximate the operations performed by the Sin and Cos blocks 806 and 808. For example, in place of the Sin block 810, the modified model 800' may include a Gain block 902 and a function block 904 configured to perform a linear approximation of a sine function. In place of the Cos block 812, the modified model 800' may include another Gain block 906 and another function block 908 configured to perform a linear approximation of a cosine function.

The IR builder 128 may generate one or more IRs for the modified model 800', and the ULP error analysis engine 600 may analyze the one or more IRs and compute a total ULP error for the modified model 800'. The blocks implementing the linear approximations for the sine and cosine operations may utilize only basic math operations whose ULP error is zero. Accordingly, the total ULP error for the modified model 800' as computed by the ULP error analysis engine 600 may be zero. The ULP error analysis engine 600 may present this total ULP error in a dialog window 910 presented with the modified model 800'.

Because the total ULP error for the modified model 800' is zero, the user is assured that there will be numerical consistency between the results computed by the modified model 800', and results produced when the algorithm of the modified model 800' is deployed in a real-world system.

In some embodiments, the ULP error analysis engine 600 may determine a total ULP error for a simulation model that uses double precision floating-point data types. A user may be interested in understanding how the ULP error may change with a different data type. For example, the user may modify the model by changing the double precision floating-point data types to single precisions floating-point data types. The ULP error analysis engine 600 may determine a total ULP error for this revised version of the model, and the two ULP errors may be compared. For example, the simulation model with values stored as single precision floating-point data types may have a higher ULP error, but this higher ULP error may still be acceptable to the user. Accordingly, the user may direct the code generator 104 to generate code from the model with values stored as single precision floating-point data types, which may result in higher speed, lower area usage, and/or lower power consumption. The data store 116 may include both single precision native floating point implementations and double precision native floating point implementations of model elements and/or operations.

In some embodiments, a user may modify the data type utilized at a portion of a simulation model at which a high ULP error is determined by the ULP error analysis engine 600. For example, the user may change the data type to a higher precision data type, e.g., a data type having more bits. Conversely, if the ULP error determined by the ULP error analysis engine 600 is lower than a level acceptable to the user, the user may change the data type to a lower precision data type, e.g., a data type having fewer bits.

Following the modification(s) to a simulation model to arrive at an acceptable ULP error, the simulation model may be provided to the code generator 104, which may generate code 614 (FIG. 6). The generated code 614 may be target independent HDL code. The generated code 614 may be provided to the hardware synthesis tool 106 to deploy the algorithm or procedure modeled by the simulation model on a real-world system 616. For example, the hardware synthesis tool 106 may configure a programmable logic device 618 of the real-world system. The hardware synthesis tool 106 may translate the generated code 614 into a bitstream or other format, and may synthesize, e.g., configure, the programmable logic device 618.

As described, the ULP error analysis engine 600 analyzes the one or more IRs 612 to determine the ULP error of a simulation model. The computed ULP error is independent of any particular target hardware, such as a particular programmable logic device from a particular device vendor. Instead, the computed ULP error remains the same regardless of the target hardware on which the algorithm of the simulation model is deployed. The computed ULP error may depend on the particular model elements utilized in the simulation model.

Optimizing a Simulation Model when Total ULP Error is Below Acceptable Level

In some embodiments, a user may be willing to accept a total ULP error for a particular simulation model or a portion of a model that is higher than the determined ULP error. For example, depending on the functionality performed by the particular simulation model and/or the target hardware at which code generated for the particular simulation model is to be deployed, a ULP error up to some threshold may be acceptable to the user. If the total ULP error computed for a simulation model or portion thereof by the ULP error analysis engine 600 is below this threshold, then one or more modifications may be made to the model to optimize the model for implementation in hardware. For example, the one or more modifications may result in the HDL code generated for the model being able to execute at higher speed, using fewer resources, (e.g., less area), of the target hardware, and/or requiring less power to run.

Suppose for example that the total ULP error computed for a given simulation model is zero, but that the user has a ULP error budget for the simulation model greater than zero. The ULP error budget may depend on the hardware on which code generated for the given simulation model will be deployed. The user may make one or more types of modifications to the simulation, for example to reduce latency, area usage, and/or power consumption of a hardware implementation of the given simulation model, even though those modifications may increase the ULP error of the simulation model. Exemplary modifications include changing the rounding mode utilized by one or more model elements of the model, changing the data type of one or more signals and/or block parameters, or changing precision.

Figure 14:
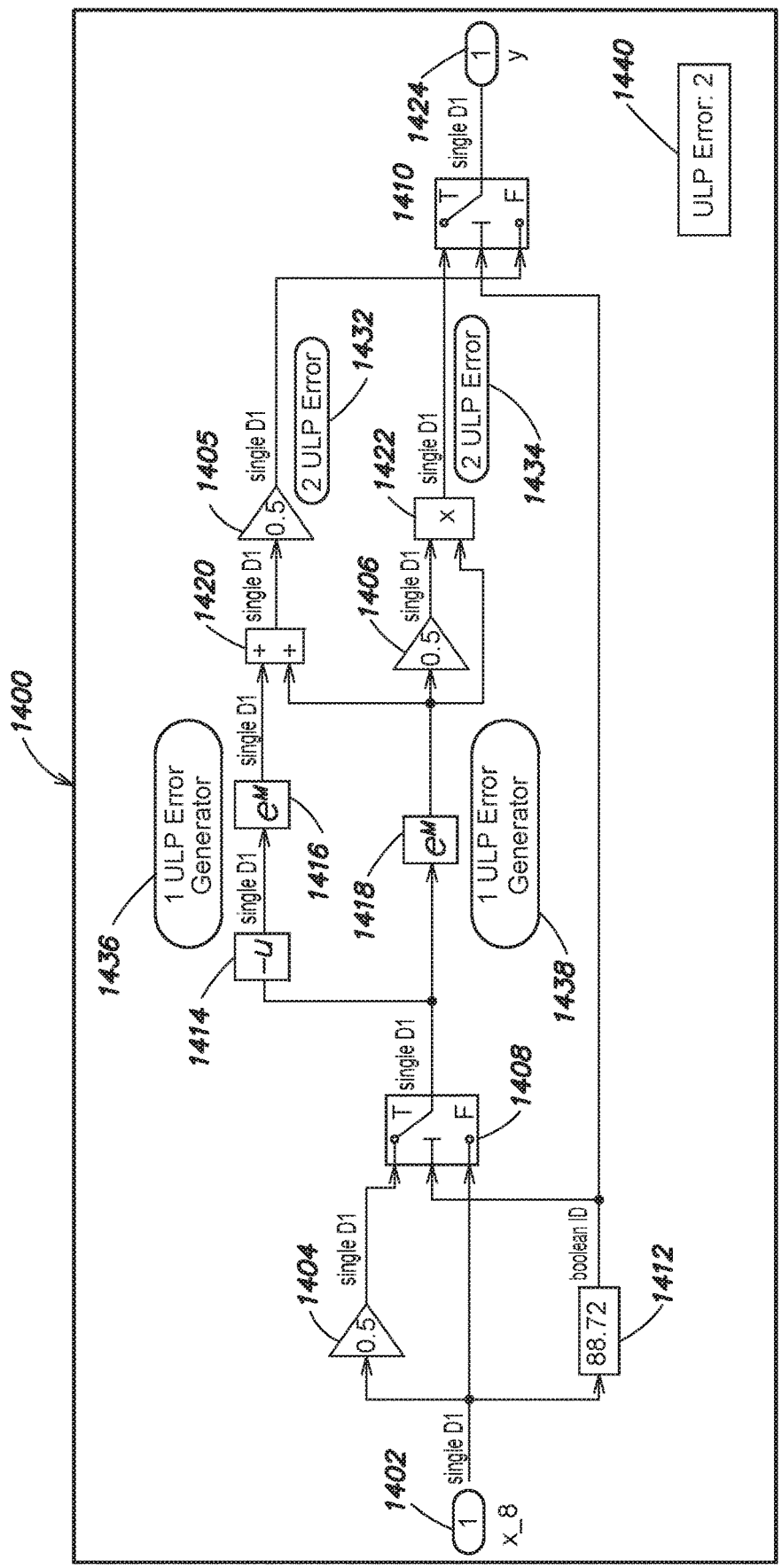
FIG. 14 is an illustration of an example simulation model.

FIG. 14 is an illustration of an example simulation model 1400. The model includes an Inport block 1402, three Gain blocks 1404-1406, two Switch blocks 1408 and 1410, a Compare to Constant block 1412, a Unary Minus block 1414, two Mathematical Function blocks 1416 and 1418 configured to perform exponential functions, an Add Block 1420, a Multiply block 1422, and an Outport block 1424. The ULP error analysis engine 600 may determine the propagation of ULP errors through the model 1400. The ULP error analysis engine 600 may present one or more graphical affordances, such as the popup windows 1432 and 1434, that present one or more of the intermediate ULP errors computed for the model 1400. In some embodiments, the ULP error analysis engine 600 may also present graphical affordances that indicate the ULP error generated by at least some of the model elements. For example, the engine 600 may present popup windows 1436 and 1438 that indicate that the exponential function blocks 1416 and 1418 each generate a ULP error of one.

As indicated by a graphical affordance 1440, the total ULP error calculated for the simulation model 1400 is two. Suppose the user has a ULP error budget of six. In this case, the exponential function blocks 1416 and 1418 may be replaced with implementations that have lower latency, but have a ULP error of three. If the user's ULP error budget were increased to seven, then the rounding mode of the Add block 1420 may be relaxed. If the user's ULP error budget were increased to eight, then the rounding mode of the Multiply block 1422 may be relaxed. These modifications may reduce the area usage when the algorithm or procedure of the simulation model 1400 is implemented in hardware.

Measuring Cancellation Errors in Terms of ULP

As described, cancellation errors can occur when subtracting two numbers represented in floating-point data type that are almost equal.

Figure 10:
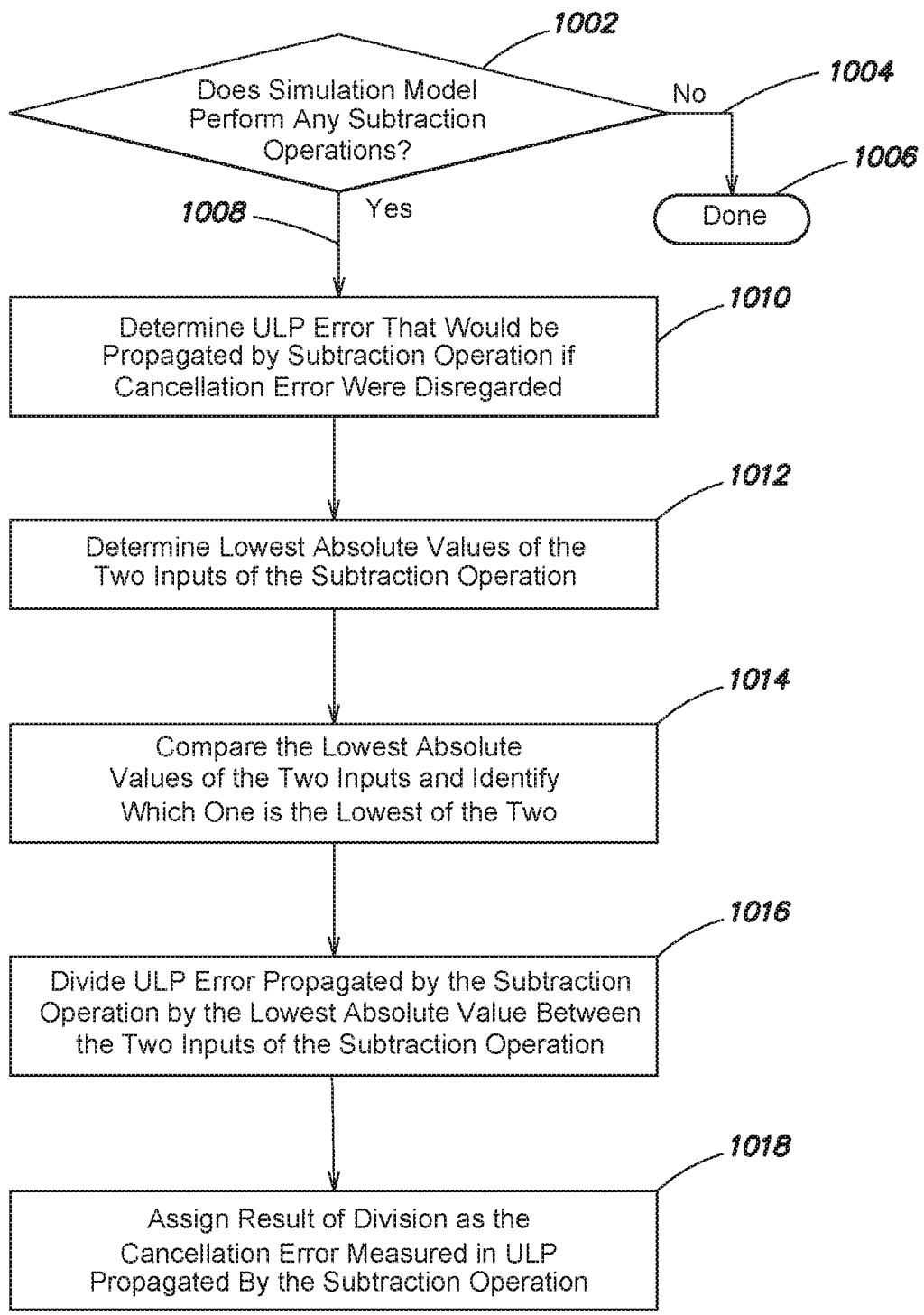
FIG. 10 is a flow diagram of an example method of measuring cancellation error in terms of ULP in accordance with one or more embodiments.

FIG. 10 is a flow diagram of an example method of measuring cancellation error in terms of ULP in accordance with one or more embodiments. The model analyzer 602 may analyze the one or more IRs generated for a model, and determine whether the model performs any subtraction operations, as indicated at decision block 1002. For example, the analyzer 602 may determine whether the model has a Subtract block. If the model has an Add block, the analyzer 602 may determine whether the values at the two inputs may have different signs, e.g., one positive and the other negative, at model runtime. If so, the analyzer 602 may consider the Add block as performing a subtraction operation. If the analyzer 602 can prove that the inputs to the Add block are always positive, e.g., the inputs are squared, then the analyzer 602 may conclude that the Add block does not perform a subtraction operation. If the model has no subtraction operations, then no further processing is needed, as indicated by No arrow 1004 leading to Done block 1006. Addition of two operators with the same signs is equivalent to subtraction with different signs.

It should be understood that one or more subtraction operations may be performed in connection with model elements other than Subtract blocks, such as Multiply and Divide blocks. Such operations may be included in the implementation of a model element. The measuring of cancellation errors as described herein may also be applied to these subtraction operations.

If the analyzer 602 determines that the model does perform one or more subtraction operations, then for each subtraction operation, the analyzer 602 may determine the ULP error that, but for the cancellation error, would be propagated to the output of the subtraction operation, as indicated by Yes arrow 1008 leading to block 1010. For example, the analyzer 602 may follow the above described process to calculate the ULP error otherwise propagated by the subtraction operation, which itself may have a local ULP error of zero. The analyzer 602 may then determine the lowest absolute values at the two inputs to the subtraction operation during model runtime, as indicated by block 1012. To determine the lowest absolute values, the analyzer 602 may perform static analysis to determine the operations performed by the model in order to compute the two inputs to the subtraction operation and the range of the two inputs. The analyzer 602 may consider the ULP error (if any) propagated to each input of the subtraction operation when determining lowest absolute value. For example, the analyzer 602 may further lower the absolute value determined for an input by the full ULP error propagated to that input. The analyzer 602 may compare the lowest absolute values determined for the two inputs, and identify which one is the lowest, as indicated by block 1014.

Static range analysis may include analyzing the range of values for individual computations included in a model based on design ranges specified for the model, if any, inputs to the model, and the semantics of the calculations of the model elements. A suitable static range analysis includes the static range analysis performed by the Fixed Point Designer tool from The MathWorks, Inc. In some embodiments, a formal proof-based technique, such as abstract interpretation, may be used, as described in the Polyspace family of products from The MathWorks, Inc.

The analyzer 602 may divide the ULP error propagated to the output of the subtraction operation, e.g., at step 1010, by the lowest absolute value of the two inputs from the compare step 1014, as indicated at block 1016. The result of this division step 1016 represents the cancellation error for subtraction operation as measured in ULP. The ULP error analysis engine 600 may assign the result of the division step 1016 as the ULP error propagated by the subtraction operation, as indicated at block 1018. This ULP error may be utilized by the ULP error analysis engine 600 in computing the ULP error propagated through the rest of the graph-based IR for the model.

This process may be repeated for each subtraction operated found in the model.

Propagating ULP Error Through Model Elements that Also Introduce ULP Error

As described, if a model element introduces a ULP error, then the ULP error propagated by that model element is the ULP error that it introduces, provided that the input to the model element has zero ULP error. If, however, the input to the model element has a ULP error, then the ULP error analysis engine 600 may calculate a bound for the ULP error propagated by the model element, and may apply this bound as the ULP error propagated by the model element.

In some embodiments, the ULP error analysis engine 600 may utilize the following approach.

For example, suppose a model element performs an operation (op) on an input (a) to produce an output (b), which may be represented as:

$$b = \text{op}(a)$$

The model element may implement the operation through a function ($f$).

The ULP error analysis engine 600 may determine the ULP error propagated by such an operation as follows:

$$ulp_b = \left| \frac{f'(a)}{f(a)} a \right| ulp_a$$

where
$f'$ is the derivative of $f$ with respect to $a$
As an example, consider the exponential function:

$$b = \exp(a)$$

As the derivative of the exponential function is the exponential function, the approach gives:

$$ulp_b \cong \left| \frac{\exp(a)}{\exp(a)} a \right| ulp_a$$

or $$ulp_b \cong a \, ulp_a$$

However, for input values a>88.728 (assuming single-precision floating point), exp(a) returns zero ULP error. Therefore, for the exponential operation:

$$ulp_b \cong 88.728 ulp_a$$

The ULP error analysis engine 600 may apply this same approach to other model elements that introduce a ULP error and for which there is a ULP error at one or more of the model element's inputs.

Detecting Whether Special Floating-Point Numbers Occur

In some embodiments, the ULP error analysis engine 600 may be configured to determine whether special floating-point numbers will occur at runtime of a simulation model. As described, special numbers may include positive and negative infinity (Inf), Not a Number (NaN) values, and non-representable numbers, e.g., denormals.

Figure 11:
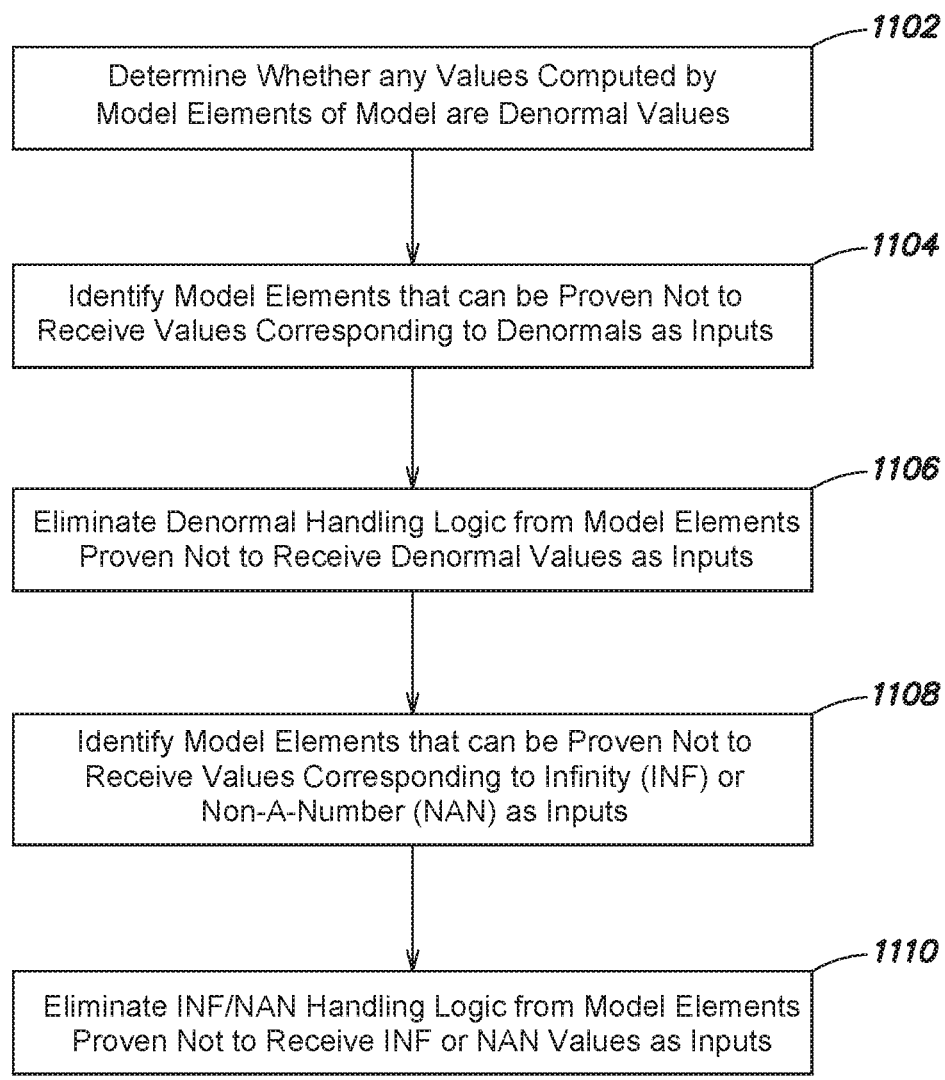
FIG. 11 is a flow diagram of an example method of detecting the occurrence of special values in accordance with one or more embodiments.

FIG. 11 is a flow diagram of an example method of detecting the occurrence of special values in accordance with one or more embodiments. The detector 604 may analyze a simulation model to determine whether any of the values computed by the model elements included in the model may be denormal values, as indicated at block 1102.

For example, the detector 604 may perform static analysis on the simulation model. The static analysis may include determining the operations performed by the model elements included in the model and the range of input values to the operations or the design ranges of variables.

For example, the detector 604 may be configured to search for and/or identify predetermined operations and/or model elements that never output denormals and/or that only output denormals under particular conditions. Exemplary operations/model elements that do not output denormals include Compare, Square Root (Sqrt), Reciprocal Sqrt, Round, Celling (Ceil), Fix, Floor, Logarithmic (Log), and Cosine (Cos). The detector 604 may further be configured to search for and/or identify predetermined operations and/or model elements that only output denormals when the input values to the operations and/or model elements are denormals or are within a particular range by performing a static range analysis on the model or portion thereof. For example, Add, Subtract, Sine (Sin), and Arctangent (Atan) operations/model elements may output denormal values when the inputs to these operations are denormal values. In addition, a Multiplier operation/model element may output denormal values when the inputs are at the lower end of the normal range and thus close to subnormal numbers, such as 1.08e-19*5.96e-20. A Divide operation/model element may output denormal values when the quotient is low and the denominator is high, such as 1.08e-19/5.96e20. An Exponential operation/model element may output denormal values when its input is in the range −102.99 to −87.33.

The detector 604 may identify the model elements of the model that are proven not to receive denormal values based on the static range analysis, as indicated at block 1104. As described above, model elements proven not to receive denormal values may include certain model elements whose inputs are computed by model elements that never output denormals or by model elements for which the conditions under which such model elements may output denormals are not present. For those model elements proven not to receive denormal values, the detector 604 may direct the code generator 104 to eliminate denormal handling logic for those model elements when generating code for the model, as indicated at block 1106. The elimination of the denormal handling logic may be applied to any executable form of the model.

The detector 604 may also identify the model elements of the model that are proven not to receive infinity (Inf) or Not-a-Number (NaN) values, as indicated at block 1108. For example, the detector 604 may be configured to search for and/or identify predetermined operations/model elements that are known never to output Inf/NaN or only output Inf/NaN under particular circumstance based on the static range analysis. Operations/model elements that never output Inf include Compare, Sin, Cos, and Atan. The Add, Subtract, and Multiplier operations/model elements only output Inf if one or both inputs are Overflow or Inf. The Divide operation/model element only outputs Inf if one or both inputs is Overflow or the denominator is zero. The Sqrt, Round, Ceil, Fix, Floor, and Log operations/model elements only output Inf when the input is Inf. The Reciprocal operation/model element outputs Inf when the input is Overflow or zero. The Reciprocal Sqrt operation/model element only outputs Inf when the input is zero. The Exp operation/model element only outputs Inf when the input is greater than or equal to 88.723. The Compare operation/model element never outputs NaN. The Add, Subtract, and Multiplier operations/model elements output NaN only when one or both inputs are NaN. The Divide operation/model element only outputs NaN when one or both inputs are NaN or when performing 0/0. The Sqrt, Reciprocal Sqrt, and Log operations/model elements only output NaN when the input is NaN or negative. The Reciprocal, Round, Ceil, Fix, Floor, Exp, and Atan operations/model elements only output NaN when the input is NaN. The Sin and Cos operations/model elements only output NaN when the input is NaN or Inf.

For those model elements proven not to receive Inf or NaN values, the detector 604 may direct the code generator 104 to eliminate Inf/NaN handling logic for those model elements when generating code for the model, as indicated at block 1110. Among other benefits, eliminating such Inf/NaN handling logic may result in improved execution speed and/or reduced memory requirements of the generated code when deployed at target hardware. As described, the elimination of the Inf/NaN handling logic may be applied to any executable form of the model, for example to reduce memory and/or improve execution speed in a high performance simulation mode.

Critical Path Optimization

In some embodiments, the code generator 104 may be configured to perform critical path estimation of a simulation model. Referring to FIG. 6, the code generator 104 may include an engine 620 configured to perform critical path estimation for a simulation model. The critical path estimation engine 620 may determine the critical path of a simulation model without generating HDL code for the simulation model or running the hardware synthesis tool 106. The engine 620 may perform static timing analysis, which may not require model compilation, for the simulation model using predetermined timing data derived for target-specific devices, such as the Virtex and Zinq families of devices from Xilinx, Inc. and the Cyclone and Stratix family of devices from Altera. The timing data may be associated with particular model elements and architectures of those model elements for the target-specific devices.

Figure 15:
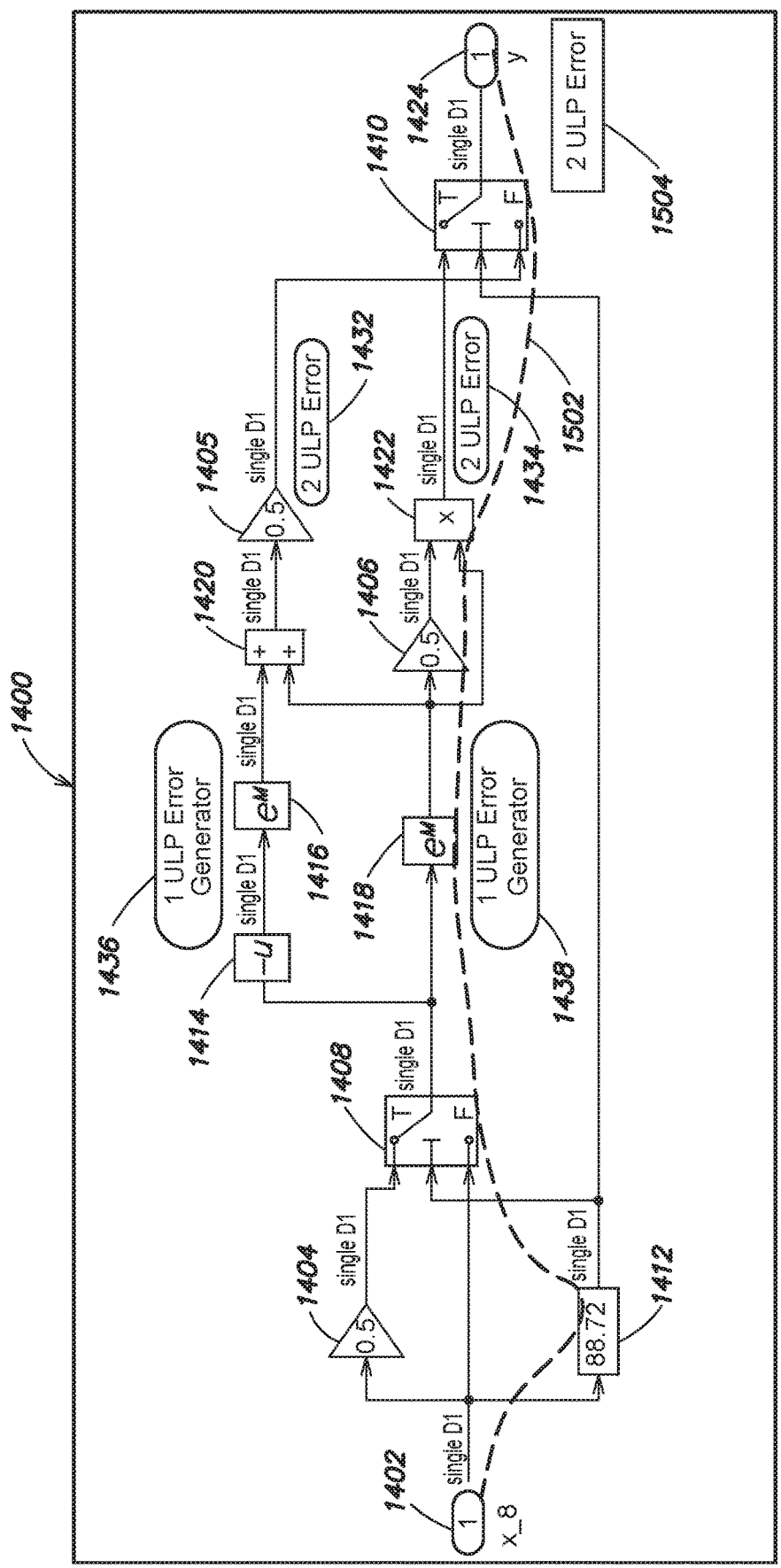
FIG. 15 is another illustration of the example simulation model of FIG. 14.

FIG. 15 is an illustration of the example simulation model 1400 for which critical path estimation may be performed. The engine 620 may perform static timing analysis to estimate the critical path through the model 1400. A suitable static timing analysis is provided by the HDL Coder tool from The MathWorks, Inc. The engine 620 may determine that the critical path is through blocks 1402, 1412, 1408, 1418, 1406, 1422, 1410, and 1424 of the model. The engine 620 may use one or more graphical affordances, such as the dotted line 1502, to mark the critical path on the model 1400.

The ULP error analysis engine 600 may determine the propagation of ULP errors through the model 1400, including the propagation of ULP errors along the critical path 1502. The ULP error analysis engine 600 may present one or more graphical affordances, such as the popup window 1504, that indicate the total ULP error computed for the critical path 1502.

If the ULP error budget for the critical path 1502 of the simulation model 1400 is higher than the ULP error computed for the critical path 1502 by the engine 600, one or more modifications may be made to the simulation model 1400 to increase the speed of the critical path 1502. For example, a model element that contributes to the path being the critical path may be replaced with an implementation that performs the same operation with a higher ULP error but also at a higher speed. For example, the user may replace the exponential function block 1418 with another native floating point implementation that also performs an exponential function, but with a higher ULP error and at a higher speed. The critical path estimation engine 620 may analyze the model as revised to determine the critical path, which may be the same as the previously identified critical path or it may be a new path through the model. This process of identifying the critical path 1502 of the simulation model 1400, computing the ULP error for the critical path, and modifying the model 1400 to improve the speed of the critical path 1502 may be repeated until the speed of the critical path meets a target frequency critical path execution time. The target critical path execution time and the ULP error budget for the critical path may be determined and/or specified by the user, for example before the critical path optimization process.

For example, as described, there may be multiple implementations of a Reciprocal operation, such as an Iterative (Shift-Add) implementation and a Newton Raphson Approximation implementation as indicated at rows 508g and 508h, respectively, of FIG. 5. The latency of the Iterative (Shift-Add) implementation may be higher than the latency of the Newton Raphson Approximation implementation. Thus, using the Reciprocal operation/model element that implements the Newton Raphson Approximation in place of the Reciprocal operation/model element that implements the Iterative (Shift-Add) may reduce latency.

Suppose additional ULP budget remains following this modification. One or more additional modifications may be made. For example, the precision of the Newton-Raphson Approximation may be reduced, e.g., from 25-bits to 23-bits, thereby potentially reducing latency even further and/or reducing area usage.

Among other benefits, the present disclosure can result in code generated from a simulation model that is more efficient, when deployed on target hardware, e.g., less hardware area requirements, improved hardware latency, and/or improved hardware timing, e.g., clock frequency. For example, as described, rounding, cancellation, and mathematical approximation errors can result in the introduction of noise in a simulation model and code generated for that model. Determining ULP errors as described herein provides a measure or bound to that noise. If the measured noise is too high, e.g., as compared to a user specified threshold, changes may be made to reduce the ULP error and thus the noise. If the measured noise is below the threshold, then changes may be made that reduce the hardware area, improve hardware latency, provide security, and/or improve hardware timing, while only increasing the noise an acceptable amount.

If the analysis determines that an operation results in 1 or more ULP that may be in error, then this bit or these bits may be set to a predetermined value independent of the operation performed. Regarding the use of ULP for security, if a system contains a multiply operation that has been determined to have 2 ULP error characteristic, then, by convention, the bit in last place of the multiply result can always be set to be 1. In another part of the system this bit may be checked whether it is always 1. If not, a security compromised flag may be raised. For example, a controller may perform a series of operations that use the ULP to set a given bit based on this convention. The resultant of the operations may be communicated to an actuator or another part of the system where the bit may be checked to determine whether it adheres to the convention. If the check fails, a warning may be issued, an exception may be raised, the communicated value may be treated differently (e.g., not used by an actuator), etc.

In some embodiments, ULP error may be utilized as a solver tolerance. A numerical solver may compute solutions, trajectories, or traces to a set of operations that include differential equations. A tolerance of a solver is set to reflect the accuracy with which the numerical results or numerical solution approximates an analytic solution. For example, during each time step, the solver may compute the state values at the end of the step and determine a local error—the estimated error of these state values. The solver may then compare the local error to an acceptable error, which may be a function of both a relative tolerance (rtol) and an absolute tolerance (atol). If the local error is greater than the acceptable error for any one state, the solvers may reduce the step size and try again. The tolerance of a numerical solution may correspond to a ULP error of certain units. The number of units may be used as input for the analysis to determine the implementation of operations performed by the solver, such that the ULP error does not exceed the solver tolerance.

In some implementations, the operations performed by a solver may be analyzed for their ULP error. Operations that have a ULP less than the overall tolerance of the numerical solution can be replaced by operations with a higher ULP that is still less than the tolerance but that are more efficient to execute as described herein. In one implementation, the solver may be modeled as a Simulink model and the ULP analysis may be performed before the model of the solver is used to generate, for example, C code of the solver software module or a part of it.

In some embodiments, the ULP errors of operations may be formulated as a set of constraints. For example, for input ULP error, u1, less than or equal to 1, a first block, Block1, may state that the resulting ULP error, y1, depends on the ULP error of the operation, x1, as y1=u1+(1−u1)*x1. So, if the ULP error of the input equals 1, then the output ULP error equals u1, which is 1. If the ULP error of the input equals 0, then the ULP error of the output equals x1. Likewise, for a second block, Block2, that represents an operation with ULP error, x2, the ULP error of the output, y2, may be y2=u2+(1−u2)*x2 given an input, u2. The connection between Block1 and Block2 may be such that the output of Block1 is connected to the input of Block2 and so the ULP error u2 equals the ULP error y1, u2=y1. The set of constraints then may be solved by having a value for the ULP error u1. These constraints can be solved by sorting, by iteration to a fix point solution, etc. For example, Hindley-Milner based methods may be used.

Identifying Spurious Results and Spurious Counterexamples During Model Verification and Validation In some embodiments, the simulation environment 102 may include or have access to a model verification and validation tool 622 (FIG. 6). The tool 622 may perform tasks including design error detection, property proving, and test case generation. In design error detection, the tool 622 may check a simulation model for the existence of design errors, such as dead logic, integer or fixed-point data overflow, division by zero, intermediate signal values that are outside of specified minimums and maximums, and out of bound array or matrix access. In property proving, the tool 622 may perform a formal analysis of a model to prove or disprove properties or objectives specified for the model. The properties or objectives may be based on requirements specified for the simulation model. In test case generation, the tool 622 may generate one or more test cases based on a selected model coverage objective or on functional requirements of the model. Test cases generated by the tool 622 may be data structures, such as vectors, arrays, functions of simulation time, functions of sample rate hits, functions of cycles, etc., having values that may be provided as inputs to the model during a simulation of the model. The input values included in a test case may be derived to exercise the functionality of the model's structure in a particular manner. The tests cases also may include values for model-level and/or block-level parameters.

To conduct its analysis, the tool 622 may convert values generated or used by the simulation model being evaluated that are in a floating point format to rational numbers. It may also approximate values that are irrational numbers, such as π (pi), with rational numbers. The conversion of numbers in floating point format to rational numbers and the use of rational approximation may result in the tool 622 concluding that objectives and/or properties specified for the model are undecided or unsatisfiable.

For example, suppose a simulation model includes a function Z=f(X, Y), and a test objective is specified to determine whether any values (that are not 0) for X and Y can be found where X=X+Y. Because the tool 622 may use rational approximation to represent numbers in floating point format, the tool 622 may conclude that this test objective is unsatisfiable because of the rational approximation. However, if floating point implementations of the model element(s) that perform this function are replaced with model elements having an NFP implementation, then the tool 622 may conclude that this test objective can be satisfied. For example, the tool 622 may determine that if X=−1.224e-29 and Y=3.664e-27, then X=X+Y. That is, the tool 622 may determine a value for X that is big enough and a value for Y that is small enough such that, when X and Y are added together, the result is not big enough to make a difference to the precision of X.

Figure 17:
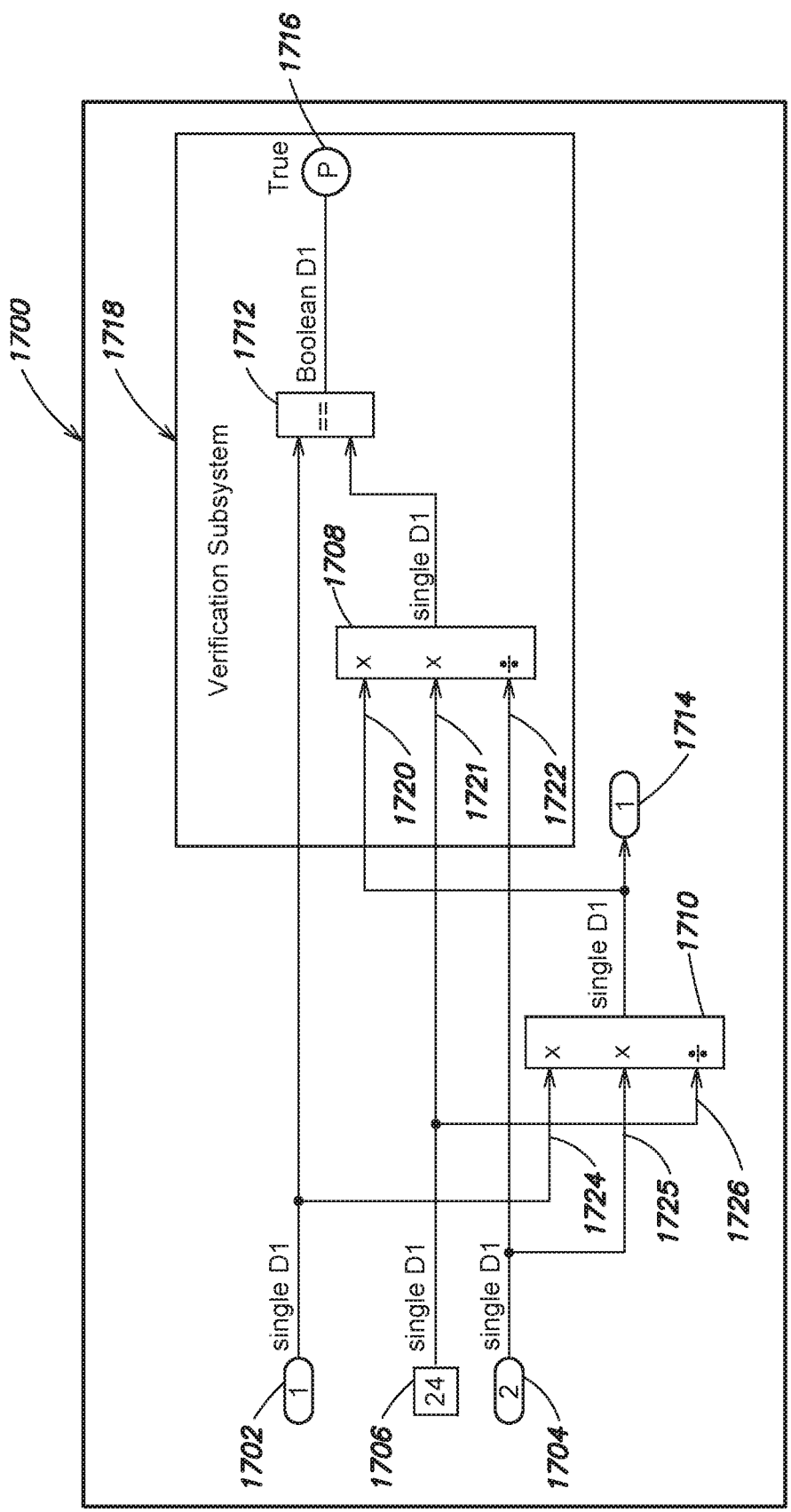
FIG. 17 is an illustration of an example simulation model.

FIG. 17 is an illustration of an example simulation model 1700 that illustrates another verification example. The model 1700 includes two Inport blocks 1702 and 1704, a Constant block 1706, two Product blocks 1708 and 1710, a Relational Operator block 1712, an Outport block 1714, and a Proof Objective block 1716. The Product block 1708, the Relational Operator block 1712, and the Proof Objective block 1716 may be contained in a Verification subsystem 1718.

The Product block 1708 has three inputs 1720-1722. It multiplies input 1720 by input 1721 and divides the result of that multiplication by input 1722. The Product block 1710 has three inputs 1724-1726, and similarly multiplies input 1724 by input 1725 and divides the result of that multiplication by input 1726. The Proof Objective block 1716 seeks values for the Inport blocks 1702 and 1704 for which the output of the Product block 1708 equals the value of the Inport block 1702.

Suppose the Product blocks 1708 and 1710 use floating point implementations, e.g., single precision floating point implementations. The tool 622 may apply a rational approximation to the division operations of the Product blocks 1708 and 1710 that results in non-linearities. The tool 622 may thus be unable to prove that there are values for the Inport blocks 1702 and 1704 for which the output of the Product block 1708 equals the value of the Inport block 1702. However, if the Product blocks 1708 and 1710 are replaced with implementations that utilize NFP, then the tool 622 may conclude that the Proof Objective block 1716 can be falsified. For example, the tool 622 may determine when the value of the Inport block 1702 is 2.062e-40 and the value of the Inport block 1704 is −1.977e-31, the Proof Objective block 1716 is falsified.

Figure 18:
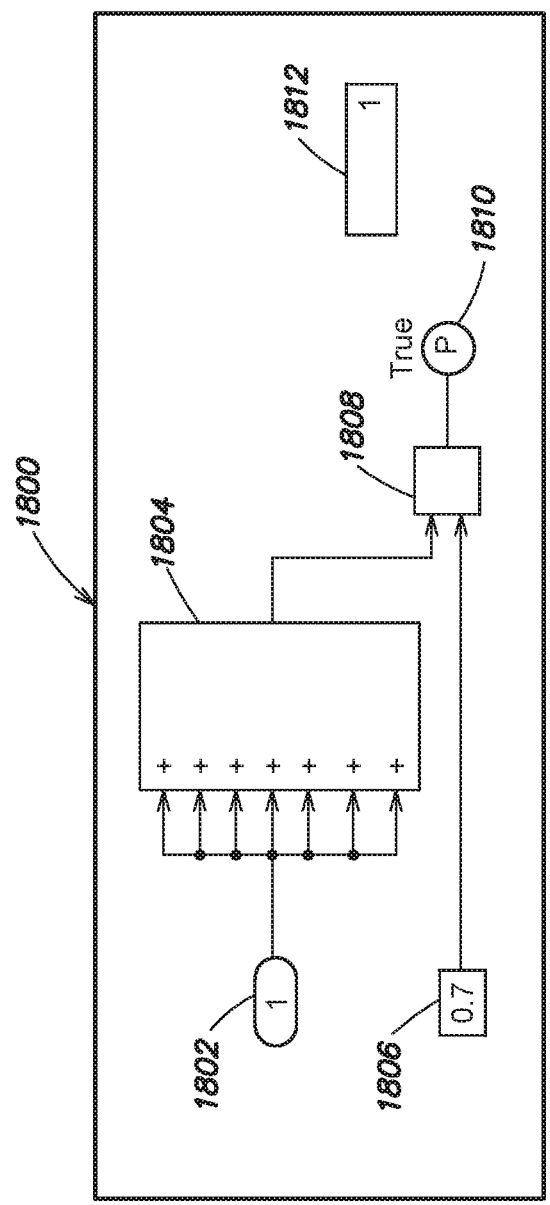
FIG. 18 is an illustration of an example simulation model.

FIG. 18 is an illustration of an example simulation model 1800 that illustrates another verification example. The model 1800 includes an Inport block 1802, an Add block 1804, a Constant block 1806, a Relational Operator block 1808, a Proof Objective block 1810, and a Display block 1812. The Add block 1804 adds the value of the Inport block 1802 seven times. The Relational Operator block 1808 determines whether the output of the Add block 1804 is not equal to the value of the Constant block 1806, i.e., 0.7, and the Proof Objective block 1810 seeks to prove that the output of the Relational Operator block 1808 is True. Suppose the Add block 1804 and the Relational Operator block 1808 use floating point implementations. Using rational approximation, the tool 622 may determine that a value of 0.1 at the Inport block 1808, when added seven times, will result in an output of the Relational Operator block 1808 of False, because 0.7=0.7. Thus, the tool 622 may generate a counter test case of 0.1. However, replacing the Add block 1804 and the Relational Operator block 1808 with NFP implementations, the tool 622 may conclude that summing 0.1 seven times is not equal to 0.7 due to rounding differences when representing the values 0.1 and 0.7. The test case provided by the tool 622 of 0.1 before utilizing NFP implementations is thus incorrect. Instead, by using NFP implementations, the tool 622 correctly concludes that there is no value for the Inport block 1802 for which the output of the Relational Operator block 1808 is false.

For example, NFP implementations of model elements with computed ULP error of zero may provide bit-accurate true emulation of floating point arithmetic.

In a further example, special floating point numbers, such as Inf and NaN, may be difficult to represent when using rational approximation. Referring to FIG. 17, when performing its analysis, the tool 622 may assume that the output of the division operation performed by the Product block 1708 is never a NaN value or a subnormal value. However, if the single precision floating point implementation of the Product block 1708 replaced with an NFP implementation, the tool 622 may prove that if the value of the Inport block 1702 is 2.062e-38 and the value of the Inport block 1704 is −0.02946, then the output of the division operation by the Product block 1708 is a subnormal value. The tool 622 may further prove that if the value of the Inport block 1702 is 5.949 and the value of the Inport block 1704 is zero, then the output of the division operation by the Product block 1708 is NaN.

Verification of Generated Code

In some embodiments, the code generator 104 may verify the code generated for a simulation model, such as the code 614 generated for the model 900. For example, the code generator 104 may include a verification engine 624 configured to verify generated code using an HDL test bench, cosimulation, or SystemVerilog Direct Programming Interface (DPI) test bench. With HDL test bench, the verification engine 624 generates an HDL test bench by running the simulation model and capturing input data and expected output data for a Device Under Test (DUT). The actual DUT output is then compared with the expected output. With cosimulation, the verification engine 624 generates a cosimulation model having a model component for the simulation model and an HDL cosimulation block. The HDL cosimulation block may interface to a simulation tool, such as ModelSim HDL simulator from Mentor Graphics or Incisive HDL simulator from Cadence. With SystemVerilog DPI test bench, the verification engine 624 generates a DPI component for the simulation model, including a DUT, and data sources. The DPI component may then interface with a simulator, such as ModelSim, Incisive, or Vivado from Xilinx.

In some embodiments, the verification engine 624 may perform a floating point tolerance check based on ULP error when verifying generated code whether by HDL test bench, cosimulation, or SystemVerilog DPI test bench. The verification engine 624 may check whether native floating point implementations are within the floating point tolerance, which may be user specified. The verification engine 624 may run a function to check the floating point tolerance.

FIG. 16 is an example code listing 1600 of a function for checking ULP accuracy during verification in accordance with one or more embodiments. As indicated at line 1, the code listing 1600 is a function definition written in the MATLAB programming language. The function is called 'ulpErrorCheck', and takes the variables 'P', 'R', and 'tolerance' as input arguments and computes the variable 'err' as an output argument. The input argument 'P' is the computation result produced by a double-precision floating point implementation of a model element being evaluated by the ulpErrorCheck function. The input argument 'R' is the computation result produced by the native floating point implementation of the model element through HDL test bench, cosimulation, or SystemVerilog test bench. The value of 'tolerance' may be specified by the user.

As indicated at lines 2 and 3, the 'P' and a' input arguments are converted from double precision floating-point data types to fixed-point data types. For example, the values may be converted from double precision floating-point data types to 64-bit signed integer with zero fraction length data types without altering the value of 'P' and 'R', e.g., using the MATLAB typecast function. Those values may then be converted to fixed-point numeric objects, e.g., using the MATLAB fixed point numeric object constructor, 'fi'. At line 4 it is determined whether the 'P' and 'R' input arguments have the same sign. At line 5, a check is performed to determine whether the two numbers have the same sign. If so, at line 6, the ULP error (err) is calculated as the absolute value of the difference between the two numbers (in fixed point data type). Else, at lines 7 and 8, the numbers have different signs, and the ULP error (err) is calculated by adding the absolute values of the two numbers (in fixed point data type).

It should be understood that the code listing 1600 is for purposes of explanation, and that other code and/or functions may be used. For example, if the values for 'P' and 'a' are single precision floating-point data types, then they may be converted to 32-bit integer data types.

Sample Report

Figure 19:
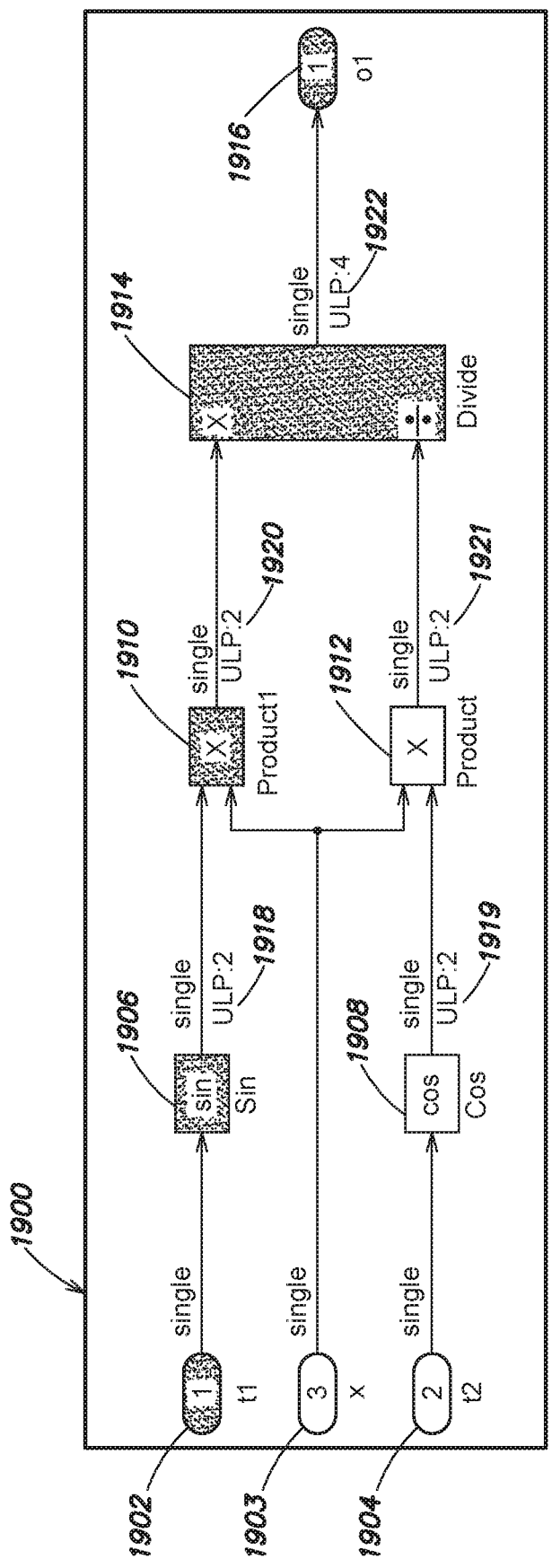
FIG. 19 is an illustration of an example simulation model in accordance with one or more embodiments.

FIG. 19 is an illustration of an example simulation model 1900 in accordance with one or more embodiments. The model 1900, which may be named 'sample1/Subsystem_ZR_ULP', may include three Inport blocks 1902-1904 named 't1', 'X', and 't2', a Sin block 1906, a Cos block 1908, two Product blocks 1910 and 1912 named 'Product1' and 'Product', a Divide block 1914, and an Outport block 1916 named 'o1'. As described, the ULP error analysis engine 600 may analyze the model 1900, determine intermediate ULP errors, and compute a total ULP error for the model 1900. The engine 1900 may present the intermediate ULP errors through one or more graphical affordances. For example, the engine may include five popup windows 1918-1922 that present the determined intermediate ULP errors.

The engine 600 also may compute the total ULP error for the model 1900, may compare the total ULP error to a tolerance specified for the model 1900, and may generate one or more suggested modifications based on the comparison. The engine 600 may generate a report including this information.

Figure 20:
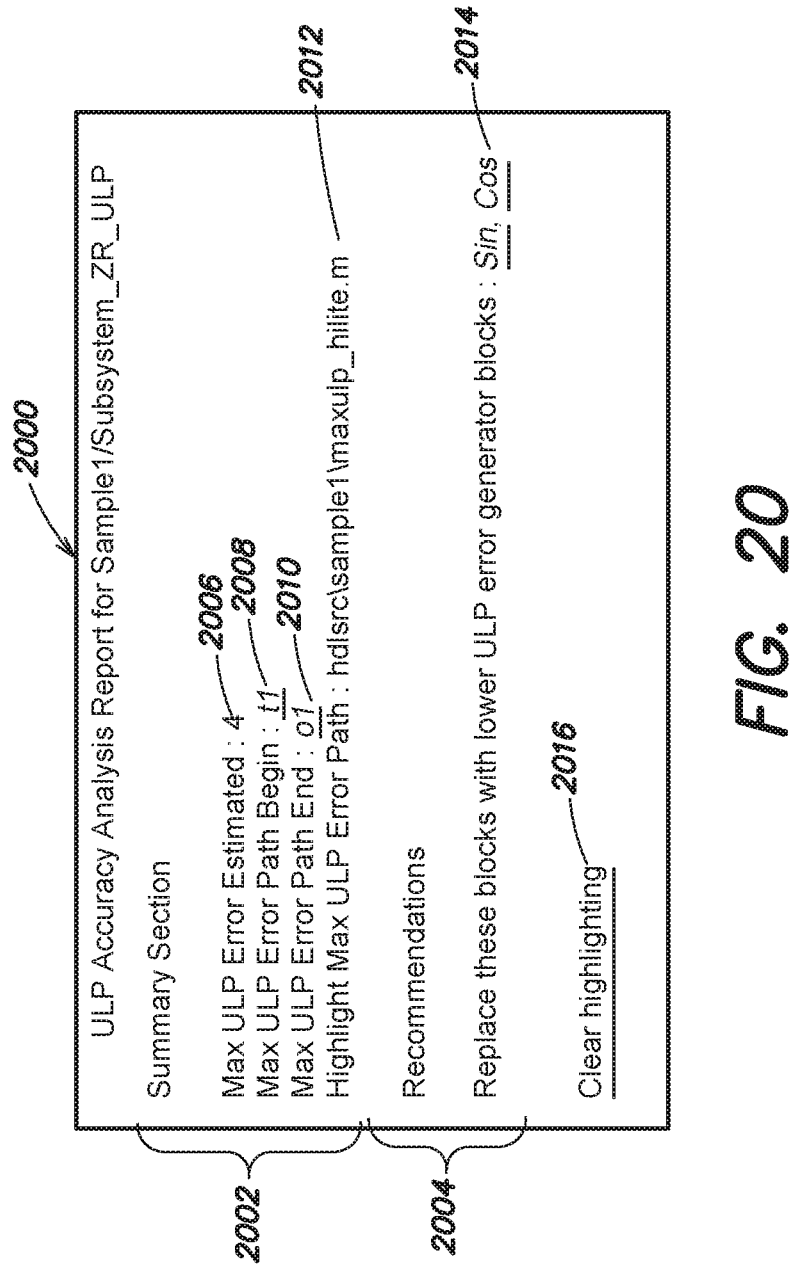
FIG. 20 is an illustration of an example report in accordance with one or more embodiments.

FIG. 20 is an illustration of an example report 2000 for the simulation model 1900 in accordance with one or more embodiments. The report 2000 may include a summary section 2002 and a recommendations section 2004. The summary section 2002 may include an entry 2006 that presents the computed total ULP error for the model 1900, e.g., four. The summary section 2002 also may include entries 2008 and 2010 that indicate the model elements at the start and end of the path corresponding to the computed total ULP error, e.g., the path from the t1 Inport block 1902 to the o1 Outport block 1916. The summary section 2002 also may include a command 2012 for highlighting the path corresponding to the computed total ULP error.

The recommendations section 2004 may include the one or more suggested modifications determined by the engine 600, as indicated at entry 2014, based on the comparison between the specified tolerance for the model 1900 and the computed total ULP error, e.g., four. Suppose the computed total ULP error exceeds the tolerance. The engine 600 may determine which model elements included in the model 600 have high ULP errors, based on the information in the data store 500. The engine 600 may determine that the Sin and Cos blocks 1906 and 1908 have high ULP errors relative to the other blocks included in the model 1900. Accordingly, the one or more suggested modifications recommend replacing the Sin and Cos blocks 1906 and 1908 with other blocks that perform the same functionality, but have lower ULP errors.

In some embodiments, in response to user input, the ULP error analysis engine 600 may automatically make one or more changes to a model. For example, the engine may identify the existing block in the model, locate it within the, identify the replacement block (or blocks), and reconnection, e.g., rewire, the existing connections of the existing (now removed) block with the connections for the replacement block (or blocks).

The report 2000 also may include a command 2016 for clearing the highlighting of the path with the highest ULP error.

Data Processing Device

Figure 12:
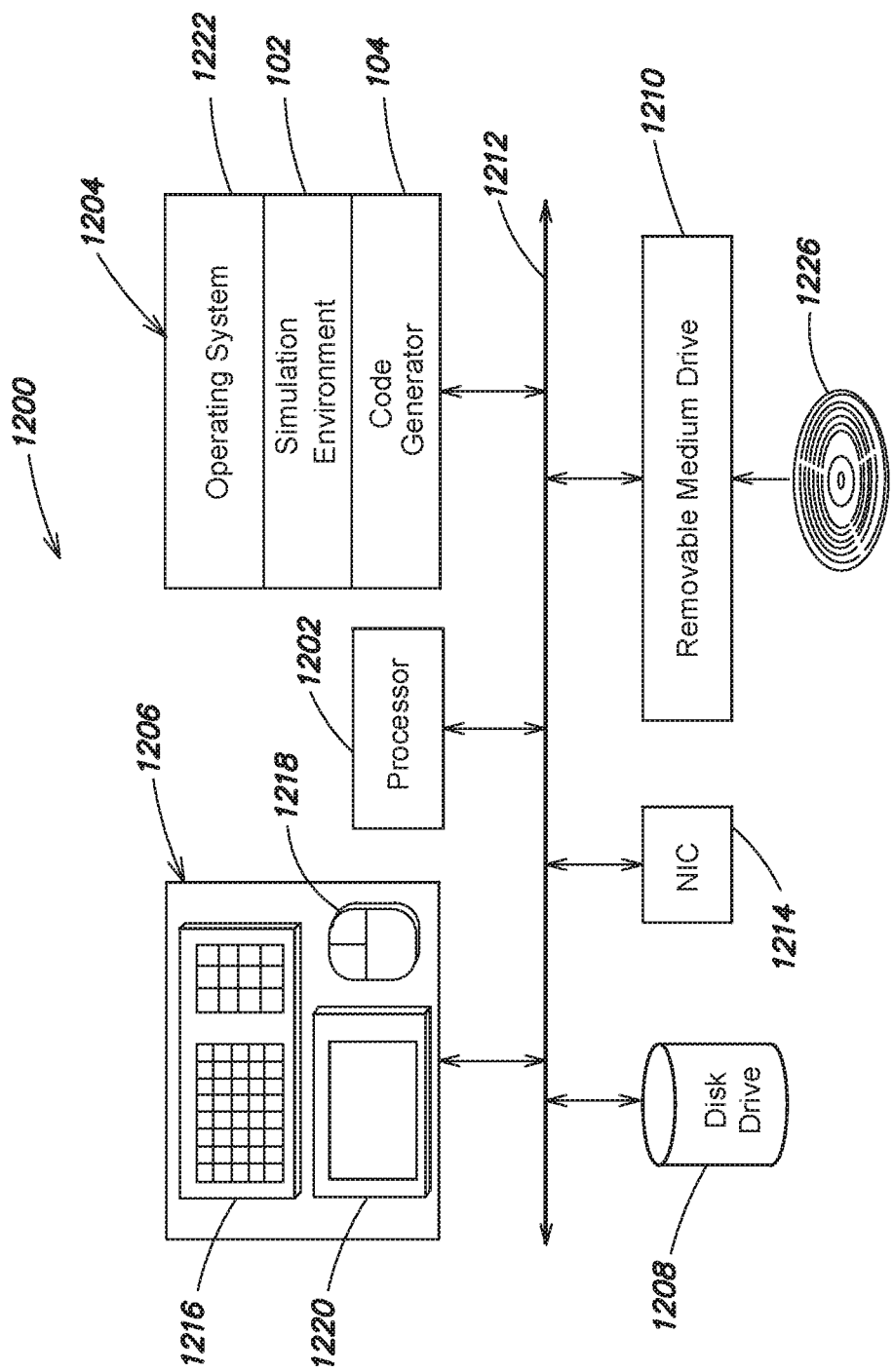
FIG. 12 is a schematic illustration of a data processing system for implementing one or more embodiments of the present disclosure.

FIG. 12 is a schematic illustration of a computer or data processing system 1200 for implementing one or more embodiments of the present disclosure. The computer system 1200 may include one or more processing elements, such as a processor 1202, a main memory 1204, user input/output (I/O) 1206, a persistent data storage unit, such as a disk drive 1208, and a removable medium drive 1210 that are interconnected by a system bus 1212. The computer system 1200 may also include a communication unit, such as a network interface card (NIC) 1214. The user I/O 1206 may include a keyboard 1216, a pointing device, such as a mouse 1218, and a display 1220. Other user I/O 1206 components include voice or speech command systems, touchpads and touchscreens, printers, projectors, etc. Exemplary processors include single or multi-core Central Processing Units (CPUs), Graphics Processing Units (GPUs), Digital Signal Processors (DSPs), Field Programmable Gate Arrays (FPGAs), Application Specific Integrated Circuits (ASICs), microprocessors, microcontrollers, etc.

The main memory 1204, which may be a Random Access Memory (RAM), may store a plurality of program libraries or modules, such as an operating system 1222, and one or more application programs that interface to the operating system 1222, such as the simulation environment 102 and the code generator 104.

The removable medium drive 1210 may accept and read a computer readable medium 1226, such as a CD, DVD, floppy disk, solid state drive, tape, flash memory or other non-transitory medium. The removable medium drive 1210 may also write to the computer readable medium 1226.

Suitable computer systems include personal computers (PCs), workstations, servers, laptops, tablets, palm computers, smart phones, electronic readers, and other portable computing devices, etc. Nonetheless, those skilled in the art will understand that the computer system 1200 of FIG. 12 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 1200 may be hosted on one or more cloud servers or devices, and accessed by remote clients through a web portal or an application hosting system, such as the Remote Desktop Connection tool from Microsoft Corp.

Suitable operating systems 1222 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1222 may provide services or functions for applications or modules, such as allocating memory, organizing data objects or files according to a file system, prioritizing requests, managing I/O, etc. The operating system 1222 may run on a virtual machine, which may be provided by the data processing system 1200.

As indicated above, a user, such as an engineer, scientist, programmer, developer, etc., may utilize one or more input devices, such as the keyboard 1216, the mouse 1218, and the display 1220 to operate the modeling environment 102 to, e.g., open, construct, and revise one or more simulation models, and may operate the code generator 104 to generate code, such as HDL code, for the simulation models. As discussed, the simulation models may be computational and may be executable, e.g., by the modeling environment 102. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Distributed Environment

Figure 13:
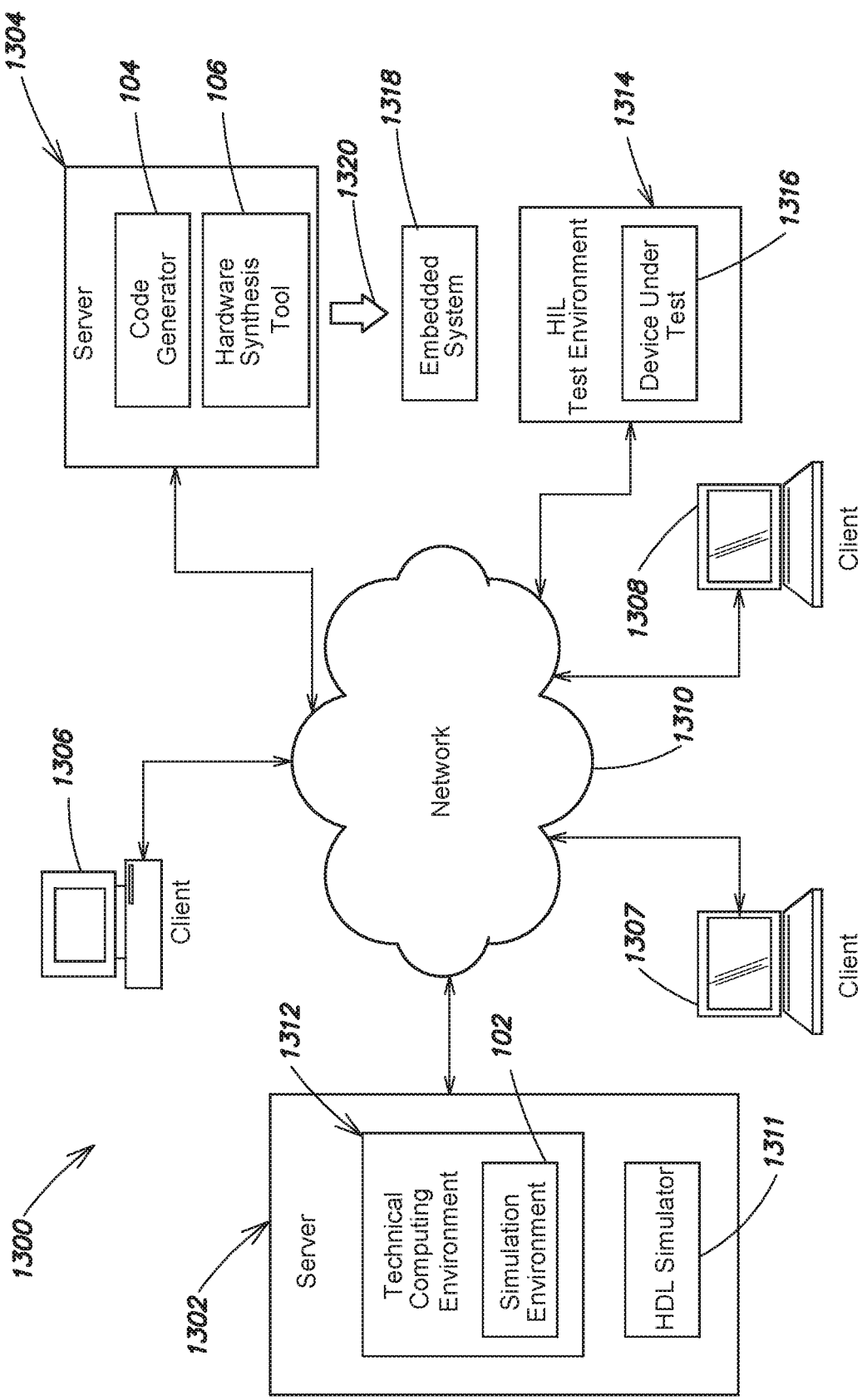
FIG. 13 is a schematic diagram of a distributed computing environment in which systems and/or methods described herein may be implemented.

FIG. 13 is a schematic diagram of a distributed computing environment 1300 in which systems and methods described herein may be implemented. The environment 1300 may include client and server devices, such as two servers 1302 and 1304, and three clients 1306-1308, interconnected by one or more networks, such as network 1310. The servers 1302 and 1304 may include applications or processes accessible by the clients 1306-1308. For example, the server 1302 may run an HDL simulator 1311 and a technical computing environment (TCE) 1312 in which the simulation environment 102 may run. The server 1304 may run the code generator 104 and the hardware synthesis tool 106. The devices of the environment 1300 may interconnect via wired connections, wireless connections, or a combination of wired and wireless connections.

The distributed environment 1900 may include a Hardware-in-the-Loop (HIL) test environment 1314, which may include a device under test (DUT) 1316. The hardware synthesis tool 106 may utilize code generated by the code generator 104 to deploy an algorithm or procedure of a simulation model at an embedded system 1318 as illustrated by arrow 1320.

The servers 1302 and 1304 may include one or more devices capable of receiving, generating, storing, processing, executing, and/or providing information. For example, the servers 1302 and 1304 may include a computing device, such as a server, a desktop computer, a laptop computer, a tablet computer, a handheld computer, or a similar device.

The clients 1306-1308 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1306-1308 may download data and/or code from the servers 1302 and 1304 via the network 1310. In some implementations, the clients 1306-1308 may be desktop computers, workstations, laptop computers, tablet computers, handheld computers, mobile phones (e.g., smart phones, radiotelephones, etc.), electronic readers, or similar devices. In some implementations, the clients 1306-1308 may receive information from and/or transmit information to the servers 1302 and 1304.

The network 1310 may include one or more wired and/or wireless networks. For example, the network 1310 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 13 is provided as an example. In practice, there may be additional devices and/or networks, fewer devices and/or networks, different devices and/or networks, or differently arranged devices and/or networks than those shown in FIG. 13. Furthermore, two or more devices shown in FIG. 13 may be implemented within a single device, or a single device shown in FIG. 13 may be implemented as multiple, distributed devices. Additionally, one or more of the devices of the distributed computing environment 1300 may perform one or more functions described as being performed by another one or more devices of the environment 1300.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions.

This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1200. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. Therefore, it is the object of the appended claims to cover all such variations and modifications as come within the true spirit and scope of the disclosure.

What is claimed is:

1. A computer-implemented method comprising:
   for an executable simulation model that includes model elements that perform functionality during execution of the simulation model, wherein data processed by the simulation model is in a floating point data type and the simulation model simulates a behavior of a system,
       performing, by one or more processors, a lookup on one or more data stores that include Unit in Last Place (ULP) error values determined for the model elements, the ULP error values resulting from at least one of rounding errors for the floating point data type, cancellation errors for the floating point data type, or errors from mathematical approximations of the functionality performed by the model elements;
   inferring, by the one or more processors, the ULP error values through the simulation model;
   computing, by the one or more processors, at least one total ULP error value for the simulation model based on the inferring the ULP error values through the simulation model; and
   presenting the at least one total ULP error value.

2. The computer-implemented method of claim 1 wherein the inferring includes applying one or more rules to determine intermediate ULP error values at outputs of a plurality of the model elements as a function of the ULP error values of the model elements.

3. The computer-implemented method of claim 2 wherein the ULP error value for a given model element is zero, the given model element has one or more inputs, and a first rule specifies that the intermediate ULP error value output by the given model element equals a sum of the ULP error values propagated to the one or more inputs of the given model element.

4. The computer-implemented method of claim 2 wherein the ULP error value for a given model element is a non-zero number,
   the given model elements has one or more inputs, and
   a second rule specifies that the intermediate ULP error output by the given model element is the non-zero number provided that the ULP error values at the one or more inputs to the given model element are zero.

5. The computer-implemented method of claim 2 further comprising:
   presenting one or more of the intermediate ULP error values at one or more graphical affordances.

6. The computer-implemented method of claim 5 wherein the one or more graphical affordances are popup windows located at the respective outputs of the plurality of the model elements.

7. The computer-implemented method of claim 1 wherein the floating point data type specifies a sign, an exponent, and a mantissa, and a plurality of the model elements implement a native floating point arithmetic in which the sign, the exponent, and the mantissa are interpreted as integer data types or fixed-point data types.

8. The computer-implemented method of claim 7 further comprising:
   determining the ULP error values of the plurality of the model elements by comparing first results computed by first implementations of the plurality of the model elements that use floating point arithmetic with second results computed by second implementations of the plurality of the model elements that use the native floating point arithmetic.

9. The computer-implemented method of claim 8 wherein the floating point arithmetic utilizes at least one of a half-precision floating point data type, a single-precision floating point data type, a double-precision floating point data type, a quadruple-precision floating point data type, an octuple-precision floating point data type, or an extended-precision floating point data type.

10. The computer-implemented method of claim 1 further comprising:
    generating Hardware Description Language (HDL) code for the simulation model, wherein the HDL code generated for the simulation model has the at least one total ULP error value determined for the simulation model.

11. The computer-implemented method of claim 10 wherein the floating point data type specifies values for denormals, the method further comprising:
    proving that values input to a given model element are never the denormals; and
    eliminating denormal handling logic from the HDL code for the given model element.

12. The computer-implemented method of claim 10 wherein the floating point data type specifies values for infinity (Inf) and Not a Number (NaN), the method further comprising:
    proving that values input to a given model element are never the Inf or the NaN; and
    eliminating Inf/NaN handling logic from the HDL code for the given model element.

13. The computer-implemented method of claim 1 wherein a first model element of the simulation model has a first implementation for performing the functionality of the first model element, the method further comprising:
    replacing the first implementation of the first model element with a second implementation where the second implementation
    has a different ULP error value than the ULP error value of the first implementation, and
    performs the functionality of the first model element.

14. The computer-implemented method of claim 13 wherein the different ULP error value of the second implementation is lower than the ULP error value of the first implementation.

15. The computer-implemented method of claim 14 wherein the different ULP error value of the second implementation is zero.

16. The computer-implemented method of claim 14 wherein the replacing is performed in response to the at least one total ULP error value for the simulation model exceeding a bound.

17. The computer-implemented method of claim 13 wherein the different ULP error value of the second implementation is higher than the ULP error value of the first implementation, and the second implementation represents an improvement, relative to the first implementation, in at least one of:
   execution speed;
   area usage; or
   power consumption.

18. The computer-implemented method of claim 13 wherein the first implementation of the first model element operates on input data with a first floating point data type that encompasses a first number of bits, and the second implementation operates on the input data with a second floating point data type that encompasses a different number of bits than the first number of bits.

19. The computer-implemented method of claim 18 wherein the different number of bits is greater than the first number of bits.

20. The computer-implemented method of claim 1 wherein the model elements of the simulation model are arranged in paths including a critical path, the method further comprising:
   analyzing the simulation model to identify the critical path;
   determining a ULP error value of the critical path; and
   presenting the ULP error value of the critical path in one or more first graphical affordances.

21. The computer-implemented method of claim 20 wherein the critical path includes a group of the model elements of the simulation model, the method further comprising:
   determining one or more intermediate ULP error values along the critical path of the simulation model; and
   presenting the one or more intermediate ULP error values determined along the critical path of the simulation model in one or more second graphical affordances.

22. The computer-implemented method of claim 20 wherein the critical path includes a group of the model elements of the simulation model, the method further comprising:
   determining a latency of the critical path;
   replacing a first model element from the group of the model elements with a replaced model element, wherein
      the replaced model element has a different ULP error value than the first model element, and
      the replacing changes the latency of the critical path.

23. The computer-implemented method of claim 1 wherein one or more of the model elements apply a floating point arithmetic and the floating point data type specifies a sign, an exponent, and a mantissa, the method further comprising:
   performing validation of the simulation model, wherein
      the validation involves converting one or more values to rational numbers or applies rational approximation,
      produces results for objectives or properties, and
      a given result for a given objective or a given property is deemed undecided or unsatisfiable due to the converting the one or more values to the rational numbers or the applying the rational approximation;
   replacing the one or more of the model elements that applies the floating point arithmetic with a replacement model element that applies a native floating point arithmetic in which the sign, the exponent, and the mantissa are interpreted as integer data types or fixed point data types; and
   in response to the replacing, determining a condition for which the given objective or the given property is decided or satisfied.

24. The computer-implemented method of claim 1 further comprising:
   generating generated code for the simulation model;
   computing one or more ULP error values for the generated code resulting from the at least one of the rounding errors, the cancellation errors, or the errors from the mathematical approximations.

25. The computer-implemented method of claim 24 further comprising:
   determining whether the one or more ULP errors for the generated code are within a tolerance.

26. The computer-implemented method of claim 25 wherein the tolerance is user specified.

27. The computer-implemented method of claim 24 wherein the computing the one or more ULP error values for the generated code includes:
   comparing first results computed by first implementations of the model elements of the simulation model that use floating point arithmetic with second results computed by the generated code.

28. The computer-implemented method of claim 24 wherein the generated code is Hardware Description Language (HDL) code, and the computing the one or more ULP error values for the generated code is performed using at least one of
   an HDL test bench,
   a cosimulation of the simulation model and the generated code, or
   a SystemVerilog Direct Programming Interface (DPI) test bench.

29. The computer-implemented method of claim 1 wherein
   the inferring includes determining a propagation of the ULP error values through the simulation model, and
   the computing the at least one total ULP error value is based on the propagation of the ULP error values through the simulation model.

30. The computer-implemented method of claim 2 wherein the floating point data type includes one or more last place bits and the intermediate ULP error value for a given model element is at least 1, the computer-implemented method further comprising:
   setting, at a first portion of the simulation model, the one or more last place bits to a predetermined value;
   checking, at a second portion of the simulation model, whether the one or more last place bits is at the predetermined value.

31. The computer-implemented method of claim 30 further comprising:
   if the checking reveals that the one or more last place bits is not at the predetermined value, raising a security notification.

32. The computer-implemented method of claim 1 further comprising:

executing the simulation model by a solver, wherein a tolerance of the solver is based on at least one of the ULP error values of the model elements.

33. The computer-implemented method of claim 1 further comprising:
executing the simulation model by a solver, the solver implementing one or more first operations with one or more ULP errors;
replacing the one or more first operations of the solver with one or more second operations when the one or more ULP errors are less than a tolerance of the solver.

34. One or more non-transitory computer-readable media, having stored thereon instructions that when executed by a computing device, cause the computing device to perform operations comprising:
for an executable simulation model that includes model elements that perform functionality during execution of the simulation model, wherein data processed by the simulation model is in a floating point data type and the simulation model simulates a behavior of a system,
performing, by one or more processors, a lookup on one or more data stores that include Unit in Last Place (ULP) error values determined for the model elements, the ULP error values resulting from at least one of rounding errors for the floating point data type, cancellation errors for the floating point data type, or errors due to mathematical approximations of the functionality performed by the model elements;
inferring, by the one or more processors, the ULP error values through the simulation model;
computing, by the one or more processors, at least one total ULP error value for the simulation model based on the inferring the ULP error values through the simulation model; and
presenting the at least one total ULP error value.

35. An apparatus comprising:
a display;
one or more electronic memories storing an executable simulation model that includes model elements that perform functionality during execution of the simulation model, wherein data processed by the simulation model is in a floating point data type and the simulation model simulates a behavior of a system; and
one or more processors coupled to the one or more memories and to the display, the one or more processors configured to:
perform a lookup on one or more data stores that include Unit in Last Place (ULP) error values determined for the model elements, the ULP error values resulting from at least one of rounding errors for the floating point data type, cancellation errors for the floating point data type, or errors due to mathematical approximations of the functionality performed by the model elements;
infer the ULP error values through the simulation model;
compute at least one total ULP error value for the simulation model based on the infer the ULP error values through the simulation model; and
present the at least one total ULP error value on the display.

36. The one or more non-transitory computer-readable media of claim 34 wherein the inferring includes applying one or more rules to determine intermediate ULP error values at outputs of a plurality of the model elements as a function of the ULP error values of the model elements.

37. The one or more non-transitory computer-readable media of claim 34 wherein the floating point data type specifies a sign, an exponent, and a mantissa, and a plurality of the model elements implement a native floating point arithmetic in which the sign, the exponent, and the mantissa are interpreted as integer data types or fixed-point data types, the operations further comprising:
determining the ULP error values of the plurality of the model elements by comparing first results computed by first implementations of the plurality of the model elements that use floating point arithmetic with second results computed by second implementations of the plurality of the model elements that use the native floating point arithmetic.

38. The one or more non-transitory computer-readable media of claim 34 wherein a first model element of the simulation model has a first implementation for performing the functionality of the first model element, the operations further comprising:
replacing the first implementation of the first model element with a second implementation where the second implementation
has a different ULP error value than the ULP error value of the first implementation, and
performs the functionality of the first model element.

39. The one or more non-transitory computer-readable media of claim 34 wherein the model elements of the simulation model are arranged in paths including a critical path, the operations further comprising:
analyzing the simulation model to identify the critical path;
determining a ULP error value of the critical path; and
presenting the ULP error value of the critical path in one or more first graphical affordances.

40. The one or more non-transitory computer-readable media of claim 34 further comprising:
executing the simulation model by a solver, wherein a tolerance of the solver is based on at least one of the ULP error values of the model elements.

41. The apparatus of claim 35 wherein the inferring includes applying one or more rules to determine intermediate ULP error values at outputs of a plurality of the model elements as a function of the ULP error values of the model elements.

42. The apparatus of claim 35 wherein the floating point data type specifies a sign, an exponent, and a mantissa, and a plurality of the model elements implement a native floating point arithmetic in which the sign, the exponent, and the mantissa are interpreted as integer data types or fixed-point data types, the one or more processors further configured to:
determine the ULP error values of the plurality of the model elements by comparing first results computed by first implementations of the plurality of the model elements that use floating point arithmetic with second results computed by second implementations of the plurality of the model elements that use the native floating point arithmetic.

43. The apparatus of claim 35 wherein a first model element of the simulation model has a first implementation for performing the functionality of the first model element, the one or more processors further configured to:
replace the first implementation of the first model element with a second implementation where the second implementation
has a different ULP error value than the ULP error value of the first implementation, and
performs the functionality of the first model element.

44. The apparatus of claim 35 wherein the model elements of the simulation model are arranged in paths including a critical path, the one or more processors further configured to:
    analyze the simulation model to identify the critical path;
    determine a ULP error value of the critical path; and
    present the ULP error value of the critical path in one or more first graphical affordances.

45. The apparatus of claim 35 wherein the one or more processors are further configured to:
    execute the simulation model by a solver, wherein a tolerance of the solver is based on at least one of the ULP error values of the model elements.

46. A computer-implemented method comprising:
    for an executable simulation model that includes model elements that perform functionality during execution of the simulation model, wherein data processed by the simulation model is in a floating point data type and the simulation model simulates a behavior of a system, performing, by one or more processors, a lookup on one or more data stores that include Unit in Last Place (ULP) error values determined for the model elements, the ULP error values resulting from at least one of rounding errors for the floating point data type, cancellation errors for the floating point data type, or errors from mathematical approximations of the functionality performed by the model elements;
    inferring, by the one or more processors, the ULP error values through the simulation model;
    computing, by the one or more processors, at least one total ULP error value for the simulation model based on the inferring the ULP error values through the simulation model; and
    generating code for at least a portion of the simulation model.

47. The computer-implemented method of claim 46 further comprising:
    before the generating the code, modifying the simulation model to reduce the at least one total ULP error value.

48. The computer-implemented method of claim 46 wherein the code generated for the at least a portion of the simulation model is at least one of C, C++, C#, Ada, Structured Text, Fortran, MATLAB, or Hardware Definition Language (HDL) code.

49. One or more non-transitory computer-readable media, having stored thereon instructions that when executed by a computing device, cause the computing device to perform operations comprising:
    for an executable simulation model that includes model elements that perform functionality during execution of the simulation model, wherein data processed by the simulation model is in a floating point data type and the simulation model simulates a behavior of a system, performing, by one or more processors, a lookup on one or more data stores that include Unit in Last Place (ULP) error values determined for the model elements, the ULP error values resulting from at least one of rounding errors for the floating point data type, cancellation errors for the floating point data type, or errors from mathematical approximations of the functionality performed by the model elements;
    inferring, by the one or more processors, the ULP error values through the simulation model;
    computing, by the one or more processors, at least one total ULP error value for the simulation model based on the inferring the ULP error values through the simulation model; and
    generating code for at least a portion of the simulation model.

50. The one or more non-transitory computer-readable media of claim 49 wherein the operations further comprise:
    before the generating the code, modifying the simulation model to reduce the at least one total ULP error value.

51. The one or more non-transitory computer-readable media of claim 49 wherein the code generated for the at least a portion of the simulation model is at least one of C, C++, C#, Ada, Structured Text, Fortran, MATLAB, or Hardware Definition Language (HDL) code.

* * * * *

UNITED STATES PATENT AND TRADEMARK OFFICE
CERTIFICATE OF CORRECTION

| | | |
|---|---|---|
| PATENT NO. | : 10,936,769 B2 | Page 1 of 1 |
| APPLICATION NO. | : 16/409165 | |
| DATED | : March 2, 2021 | |
| INVENTOR(S) | : Kiran K. Kintali et al. | |

It is certified that error appears in the above-identified patent and that said Letters Patent is hereby corrected as shown below:

In the Specification

Column 31, Line 21:
"As indicated at lines 2 and 3, the 'P' and a' input"
Should read:
--As indicated at lines 2 and 3, the 'P' and 'R' input--

Column 31, Line 41:
"tions may be used. For example, if the values for 'P' and 'a'"
Should read:
--tions may be used. For example, if the values for 'P' and 'R'--

Signed and Sealed this
Twenty-fourth Day of June, 2025

Coke Morgan Stewart
*Acting Director of the United States Patent and Trademark Office*